United States Patent
Fang

(10) Patent No.: US 11,502,024 B2
(45) Date of Patent: Nov. 15, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Hsu-Nan Fang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/748,566

(22) Filed: Jan. 21, 2020

(65) Prior Publication Data
US 2021/0225737 A1 Jul. 22, 2021

(51) Int. Cl.
| | | |
|---|---|---|
| H01L 23/48 | (2006.01) | |
| H01L 21/56 | (2006.01) | |
| H01L 21/768 | (2006.01) | |
| H01L 23/31 | (2006.01) | |
| H01L 21/48 | (2006.01) | |
| H01L 23/00 | (2006.01) | |

(52) U.S. Cl.
CPC ............ *H01L 23/481* (2013.01); *H01L 21/56* (2013.01); *H01L 21/76805* (2013.01); *H01L 21/76877* (2013.01); *H01L 23/3121* (2013.01); *H01L 24/05* (2013.01)

(58) Field of Classification Search
CPC ............... H01L 21/56; H01L 21/76805; H01L 21/76877; H01L 23/481; H01L 23/3121; H01L 24/05
See application file for complete search history.

(56) References Cited

U.S. PATENT DOCUMENTS

| | | | | |
|---|---|---|---|---|
| 2012/0032340 A1* | 2/2012 | Choi | ............... | H01L 21/561 257/774 |
| 2012/0211892 A1* | 8/2012 | Kim | ............... | H01L 21/561 257/774 |
| 2013/0069239 A1* | 3/2013 | Kim | ............... | H01L 24/97 257/774 |
| 2013/0228917 A1* | 9/2013 | Yoon | ............... | H01L 24/97 257/737 |
| 2014/0175663 A1* | 6/2014 | Chen | ............... | H01L 23/49816 257/774 |

(Continued)

FOREIGN PATENT DOCUMENTS

CN 109427759 A 3/2019

*Primary Examiner* — Herve-Louis Y Assouman
(74) *Attorney, Agent, or Firm* — Foley & Lardner LLP

(57) ABSTRACT

A semiconductor device package and a method of manufacturing the same are provided. The semiconductor device package includes a first semiconductor element, a first redistribution layer, a second redistribution layer, and a conductive via. The first semiconductor element has a first active surface and a first back surface opposite to the first active surface. The first redistribution layer is disposed adjacent to the first back surface of the first semiconductor element. The second redistribution layer is disposed adjacent to the first active surface of the first semiconductor element. The conductive via is disposed between the first redistribution layer and the second redistribution layer, where the conductive via inclines inwardly from the second redistribution layer to the first redistribution layer.

14 Claims, 20 Drawing Sheets

(56) References Cited

U.S. PATENT DOCUMENTS

| | | | |
|---|---|---|---|
| 2015/0108661 A1* | 4/2015 | Vincent | H01L 23/5383 |
| | | | 257/777 |
| 2015/0380394 A1* | 12/2015 | Jang | H01L 24/92 |
| | | | 438/108 |
| 2016/0150651 A1* | 5/2016 | Tsai | H01L 21/4857 |
| | | | 174/251 |
| 2016/0260684 A1* | 9/2016 | Zhai | H01L 25/0652 |
| 2016/0276307 A1* | 9/2016 | Lin | H01L 23/562 |
| 2018/0082964 A1 | 3/2018 | Wu et al. | |

\* cited by examiner

SEMICONDUCTOR DEVICE PACKAGE AND METHOD OF MANUFACTURING THE SAME

TECHNICAL FIELD

The present disclosure relates to a semiconductor device package and a method of manufacturing the same, and more particularly, to a semiconductor device package that can improve the signal transmission speed of the electrical connections.

DESCRIPTION OF THE RELATED ART

Nowadays, techniques for incorporating more than one semiconductor element into a single semiconductor package to minimize the dimensions of the package are under progressively development. Flip-chip bonding technique is one way to stack one semiconductor element onto another and electrically connect them. Typically, flip-chip bonding requires solder electrical connections. Nevertheless, utilizing solder materials for electrical connections may inevitably cause an RC delay problem, which may reduce signal transmission speed. In addition, intermetallic coverage (IMC) may be formed between the solder material and the other metals, which may also cause poor conductivity.

Given the above, it would be desirable to provide semiconductor packages with electrical connections offering faster transmission speed and at the same time satisfy industry needs for miniaturization.

SUMMARY

In an aspect, a semiconductor device package includes a first semiconductor element, a first redistribution layer, a second redistribution layer, and a conductive via. The first semiconductor element has a first active surface and a first back surface opposite to the first active surface. The first redistribution layer is disposed adjacent to the first back surface of the first semiconductor element. The second redistribution layer is disposed adjacent to the first active surface of the first semiconductor element. The conductive via is disposed between the first redistribution layer and the second redistribution layer, where the conductive via inclines inwardly from the second redistribution layer to the first redistribution layer.

In an aspect, a semiconductor device package includes a first semiconductor element, a first redistribution layer, a second redistribution layer, and a second semiconductor element. The first semiconductor element has a first active surface and a first back surface opposite to the first active surface. The first redistribution layer is disposed adjacent to the first back surface of the first semiconductor element. The second redistribution layer is disposed adjacent to the first active surface of the first semiconductor element. The second semiconductor element has a second active surface and a second back surface opposite to the second active surface, where the second active surface directly bonds to the first redistribution layer.

In an aspect, a method of manufacturing a semiconductor device package includes: providing a first semiconductor element having a first active surface and a first back surface opposite to the first active surface; disposing a first redistribution layer adjacent to the first active surface of the first semiconductor element; disposing a second semiconductor element adjacent to the first redistribution layer, wherein the second semiconductor element has a second active surface and a second back surface opposite to the second active surface and the second back surface faces the first redistribution layer; molding the second semiconductor element to form a first encapsulant surrounding the second semiconductor element; forming a conductive via in the first encapsulant; and disposing a second redistribution layer adjacent to the second active surface of the second semiconductor element.

DETAILED DESCRIPTION

Spatial descriptions, such as "above," "top," and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

In some embodiments, the present disclosure provides a semiconductor device package including a first semiconductor element, a first redistribution layer, a second redistribution layer, and a conductive via. The conductive via is disposed between the first redistribution layer and the second redistribution layer so an electrical signal may be transmitted from one side of the first redistribution layer to the other side of the second redistribution layer. In addition, since the conductive via is formed by a laser drilling technique or a mechanical drilling technique followed by a plating technique, the conductive via may have a higher aspect ratio compared to a conductive via disposed by picking and placing a preformed one, which may in turn results in a higher number of electrical connections (i.e., higher I/Os) as it requires less surface area than a conventional one.

In some embodiments, the present disclosure provides a semiconductor device package including a first semiconductor element, a first redistribution layer, a second redistribution layer, and a second semiconductor element. The second semiconductor element has a second active surface and a second back surface opposite to the second active surface, wherein the second active surface directly bonds to the first redistribution layer. By the techniques provided in the present disclosure, directing bonding the second semiconductor element to the first redistribution layer becomes possible and so is a solder-free flip-chip technique. Therefore, according to the semiconductor device package of the present disclosure, superior advantages of a flip-chip technique, including higher I/Os, superior heat dissipation effect and flexibility for further improvement, and reduction of package size, and advantages of a solder-free technique including reducing solder contamination possibilities can be achieved.

Figure 1A:
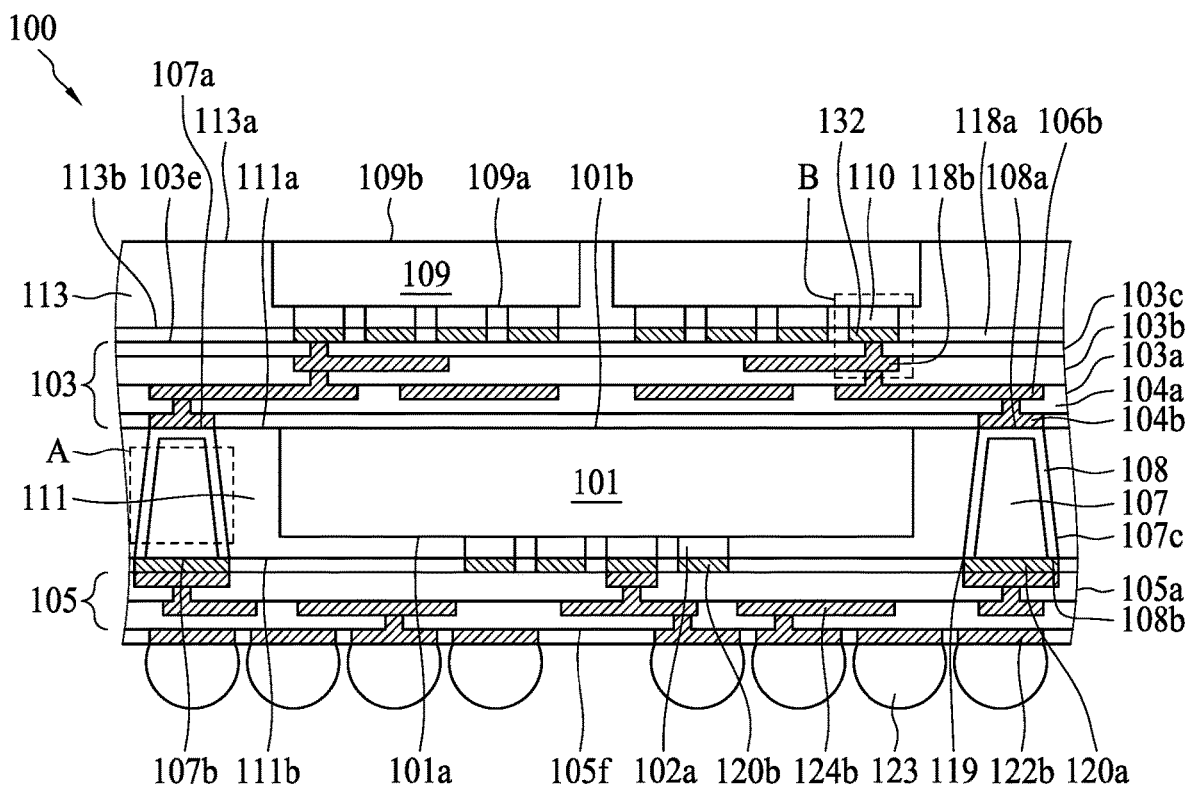
FIG. 1A illustrates a cross-sectional view of a semiconductor device package according to some embodiments of the present disclosure.

FIG. 1A illustrates a cross-sectional view of a semiconductor device package according to some embodiments of the present disclosure. The semiconductor device package 100 of FIG. 1A includes a first semiconductor element 101, a first redistribution layer 103, a second redistribution layer 105, and a conductive via 107.

The first semiconductor element 101 has a first active surface 101a and a first back surface 101b opposite to the first active surface 101a. The first semiconductor element 101 may be a die, a chip, a package, an interposer, or a combination thereof. In some embodiments, the first semiconductor element 101 is a die. At least one first conductive terminal 102a may be disposed adjacent to the first active surface 101a of the first semiconductor element 101 for external electrical connection.

The first redistribution layer (RDL) 103 is disposed adjacent to the first back surface 101b of the first semiconductor element 101. In some embodiments, the first RDL 103 is disposed on (e.g., physical contact) the first back surface 101b of the first semiconductor element 101. The first RDL 103 may include a single layer containing a dielectric layer and at least one conductive trace disposed thereon (or embedded therein) or include multiple layers which have multiple dielectric layers stacked together where each has at least one conductive trace disposed thereon (or embedded therein) for redistributing electrical signals to external electrical connectors or to another RDL. In some embodiments, such as the one illustrated in FIG. 1A, the first RDL 103 includes a first bottom RDL 103a, a first middle RDL 103b, and a first top RDL 103c, which may include a portion of the conductive traces that electrically connect to each other vertically, a portion of the conductive traces that electrically connect to each other horizontally, or both.

The first bottom RDL 103a may be the outmost layer of the first RDL 103 and disposed adjacent to the first back surface 101b of the first semiconductor element 101. The first bottom RDL 103a may include a first bottom RDL dielectric layer 104a and a first bottom RDL conductive trace 104b disposed on (e.g., physical contact or embedded in and exposed by) the first bottom RDL dielectric layer 104a. The first bottom RDL conductive trace 104b may electrically connect to the first middle RDL conductive trace 106b of the first middle RDL 103b The first bottom RDL dielectric layer 104a may include, for example, one of, or a combination of, a photosensitive material (e.g., polyimide (PI), polyamide (PA), or other suitable materials), an epoxy material, a resin material (e.g., Ajinomoto Build-up Film (ABF)), cyclophentadiene (CPD), poly-p-phenylene benzobisoxazole (PBO), a solder mask material, a fiber, and an inorganic material (e.g., $Ta_2O_5$, $SiO_2$, $Si_3N_4$, or other suitable materials). In some embodiments, the first bottom RDL dielectric layer 104a includes polyimide. In some embodiments, the first bottom RDL conductive trace 104b may include, for example, one of, or a combination of, copper, gold, indium, tin, silver, palladium, osmium, iridium, ruthenium, titanium, magnesium, aluminum, cobalt, nickel, or zinc, or other metals or metal alloys.

The first top RDL 103c may be the outmost layer of the first RDL 103 and disposed adjacent to the first middle RDL 103b. The first top RDL 103c may include a first top RDL dielectric layer 118a and a first top RDL conductive trace 118b disposed on (e.g., physical contact or embedded in and exposed by) the first top RDL dielectric layer 118a. The first top RDL conductive trace 118b may electrically connect to the first middle RDL 103b. The first top RDL dielectric layer 118a may include, for example, one of, or a combination of, a photosensitive material (e.g., polyimide (PI), polyamide (PA), or other suitable materials), an epoxy material, a resin material (e.g., Ajinomoto Build-up Film (ABF)), cyclophentadiene (CPD), poly-p-phenylene benzobisoxazole (PBO), a solder mask material, a fiber, and an inorganic material (e.g., $Ta_2O_5$, $SiO_2$, $Si_3N_4$, or other suitable materials). In some embodiments, the first top RDL dielectric layer 118a includes polyimide. In some embodiments, the first top RDL conductive trace 118b may include, for example, one of, or a combination of, copper, gold, indium, tin, silver, palladium, osmium, iridium, ruthenium, titanium, magnesium, aluminum, cobalt, nickel, or zinc, or other metals or metal alloys.

At least one second conductive terminal 132 may be disposed adjacent to a surface of the first top RDL 103c for external electrical connection.

The second redistribution layer (RDL) 105 is disposed adjacent to the first active surface 101a of the first semiconductor element 101. In some embodiments, the second RDL 105 is disposed above the first active surface 101a of the first semiconductor element 101. In some embodiments, the second RDL 105 electrically connects to the first active surface 101a of the first semiconductor element 101.

The second RDL 105 may include a single layer containing a dielectric layer and at least one conductive trace disposed thereon (or embedded therein) or include multiple layers which have dielectric layers stacked together where each has at least one conductive trace disposed thereon (or embedded therein) for redistributing electrical signals to external electrical connectors or to another RDL. In some embodiments, such as the one illustrated in FIG. 1A, the second RDL 105 only includes a single layer containing a second RDL dielectric layer 105a and at least one second RDL conductive trace 124b disposed thereon (or embedded therein and exposed thereby). In some embodiments, the second RDL 105a electrically connects to the first active surface 101a of the first semiconductor element 101 and provide external electrical connection for the first semiconductor element 101. The second RDL dielectric layer 105a may include, for example, one of, or a combination of, a photosensitive material (e.g., polyimide (PI), polyamide (PA), or other suitable materials), an epoxy material, a resin material (e.g., Ajinomoto Build-up Film (ABF)), cyclophentadiene (CPD), poly-p-phenylene benzobisoxazole (PBO), a solder mask material, a fiber, and an inorganic material (e.g., $Ta_2O_5$, $SiO_2$, $Si_3N_4$, or other suitable materials). In some embodiments, the second RDL dielectric layer 105a includes polyimide. In some embodiments, the second RDL conductive trace 124b may include, for example, one of, or a combination of, copper, gold, indium, tin, silver, palladium, osmium, iridium, ruthenium, titanium, magnesium, aluminum, cobalt, nickel, or zinc, or other metals or metal alloys.

At least one third conductive terminal 120a, 120b may be disposed adjacent to a surface of the second RDL 105a for external electrical connection. In some embodiments, the second RDL 105a electrical connects to the first active surface 101a of the first semiconductor element 101 through the third conductive terminal 120b and the conductive via 107 through the third conductive terminal 120a.

The conductive via 107 is disposed between the first RDL 103 and the second RDL 105. The conductive via 107 inclines inwardly from the second RDL 105 to the first RDL 103. The conductive via 107 may electrically connect to the first RDL 103, the second RDL 105, or both. In some embodiments, the conductive via 107 electrically connects the first RDL 103 to the second RDL 105 so an electrical signal may be transmitted from one side of the first RDL 103 to the other side of the second RDL 105. In some embodiments, the conductive via 107 electrically connects to the first RDL 103 through connecting to the first bottom RDL conductive trace 104b of the first bottom RDL 103a and electrically connects to the second RDL 105 through connecting to the third conductive terminal 120a. Since the conductive via 107 is formed by a laser drilling technique or a mechanical drilling technique followed by a plating technique, the conductive via 107 may have a higher aspect ratio compared to a conductive via disposed by a pick and place technique where the conductive via may be disposed by picking and placing a preformed conductive column, which may in turn results in a higher number of electrical connections (i.e., higher I/Os) as a conductive column requires more surface area than the conductive via 107 of the present disclosure. The aspect ratio of the conductive via 107 may range from 1:1 to 1:10, 1:2.5 to 1:10, 1:5 to 1:10, or 1:7 to 1:10. In some embodiments, the aspect ratio of the conductive via 107 ranges from 1:5 to 1:10.

In some embodiments, a first encapsulant 111 may be disposed between the first RDL 103 and the second RDL 105. The first encapsulant 111 has a first encapsulant top surface 111a and a first encapsulant bottom surface 111b opposite to the first encapsulant top surface 111a. In some embodiments, the first encapsulant top surface 111a and the via top surface 107a of the conductive via 107 are in substantially the same plane. In some embodiments, the first encapsulant bottom surface 111b and the via bottom surface 107b of the conductive via 107 are in substantially the same plane. In some embodiments, the first encapsulant top surface 111a, the via top surface 107a of the conductive via 107, and the first back surface 101b of the first semiconductor element 101 are in substantially the same plane.

The first encapsulant 111 may surround the conductive via 107. In some embodiments, the first encapsulant 111 and the conductive via 107 are connected at a first interface 107c. The first encapsulant 111 may surround the first semiconductor element 101. In some embodiments, the first encapsulant 111 surrounds the conductive via 107 and the first semiconductor element 101. In some embodiments, the first encapsulant 111 surrounds the conductive via 107 and the first semiconductor element 101 and covers at least a portion of the first active surface 101a of the first semiconductor element 101. In some embodiments, the first encapsulant 111 surrounds the first conductive terminal 102a disposed adjacent to the first active surface 101a of the first semiconductor element 101 and/or the second conductive terminal 120b disposed adjacent to a surface of the second RDL 105a to protect them from oxidation, moisture, and other environment conditions to meet the packaging application requirements. The first encapsulant 111 may be, for example, a solder mask (the material of which is, for example, polyimide (PI)), a passivation layer (the material of which is, for example, a metal oxide), or an underfill. The first encapsulant 111 may include fillers, the material of which is, for example, silica and/or carbon for reducing stress on the die and warpage of a resulting semiconductor package.

In some embodiments, a first seed layer 108 may be further included in the conductive via 107. The first seed layer 108 may be disposed in the recess 119 of the first encapsulant 111. In some embodiments, the first seed layer 108 is disposed on the sidewall 107c of the recess 119 of the first encapsulant 111. In some embodiments, the first seed layer 108 is disposed in conformity with the sidewall 107c of the first encapsulant 111. At least a portion of the top surface 108a of the first seed layer 108 may be exposed by the first encapsulant top surface 111a of the first encapsulant 111 and in contact with the first RDL 103. At least a portion of the bottom surface 108b may be exposed by the first encapsulant bottom surface 111b of the first encapsulant 111 and in contact with the second RDL 105. At least a portion of the top surface 108a of the first seed layer 108 may be in substantially the same plane with the first encapsulant top surface 111a of the first encapsulant 111. At least a portion of the bottom surface 108b may be in substantially the same plane with the first encapsulant bottom surface 111b of the first encapsulant 111.

In some embodiments, at least one second semiconductor element 109 may be disposed adjacent to the first RDL 103. The second semiconductor element 109 may electrically connect to the first RDL 103. In some embodiments, the second semiconductor element 109 electrically connects to the first RDL 103 through the fourth conductive terminal 110 disposed adjacent to the second active surface 109a of the second semiconductor element 109 and the second conductive terminal 132 disposed adjacent to a surface of the first top RDL 103c. The second semiconductor element 109 may be a die, a chip, a package, an interposer, or a combination thereof. In some embodiments, the second semiconductor element 109 is a die.

In some embodiments, a second encapsulant 113 may be disposed adjacent to the first top surface 103e of the first RDL 103. The second encapsulant 113 has a second encapsulant top surface 113a and a second encapsulant bottom surface 113b opposite to the second encapsulant top surface 113a. In some embodiments, the second encapsulant top surface 113a exposes at least a portion of the second back surface 109b of the second semiconductor element 109. By exposing at least a portion of the second back surface 109b of the second semiconductor element 109, the heat dissipation effect of the second semiconductor element 109 may be improved. In some embodiments, a heat sink may be further disposed adjacent to the exposed portion of the second back surface 109b of the second semiconductor element 109 to further improve the heat dissipation effect. In some embodiments, the second encapsulant top surface 113a covers the second back surface 109b of the second semiconductor element 109 entirely (e.g., the second semiconductor element 109 is embedded in the second encapsulant 113). In some embodiments, the second encapsulant top surface 113a of the second encapsulant 113 and the second back surface 109b of the second semiconductor element 109 are in substantially the same plane.

The second encapsulant 113 may surround the fourth conductive terminal 110 disposed adjacent to the second active surface 109a of the second semiconductor element 109 and/or the second conductive terminal 132 disposed adjacent to a surface of the first top RDL 103c to protect them from oxidation, moisture, and other environment conditions to meet the packaging application requirements. The second encapsulant 113 may be, for example, a solder mask (the material of which is, for example, polyimide (PI)), a passivation layer (the material of which is, for example, a metal oxide), or an underfill. The second encapsulant 113 may include fillers, the material of which is, for example, silica and/or carbon for reducing stress on the die and warpage of a resulting semiconductor package.

In some embodiments, at least one electrical connector 123 may be disposed adjacent to the second bottom surface 105f of the second RDL 105. In some embodiments, the electrical connector 123 electrically connects to the second RDL 105. In some embodiments, the electrical connector 123 electrically connects to the second RDL 105 by connecting to a bonding pad 122b disposed adjacent to the second bottom surface 105f of the second RDL 105. The electrical connector 123 may be a pillar or a solder/stud bump. In some embodiments, the electrical connector 123 is a solder bump and the bonding pad 122b is a ball pad.

Figure 1B:
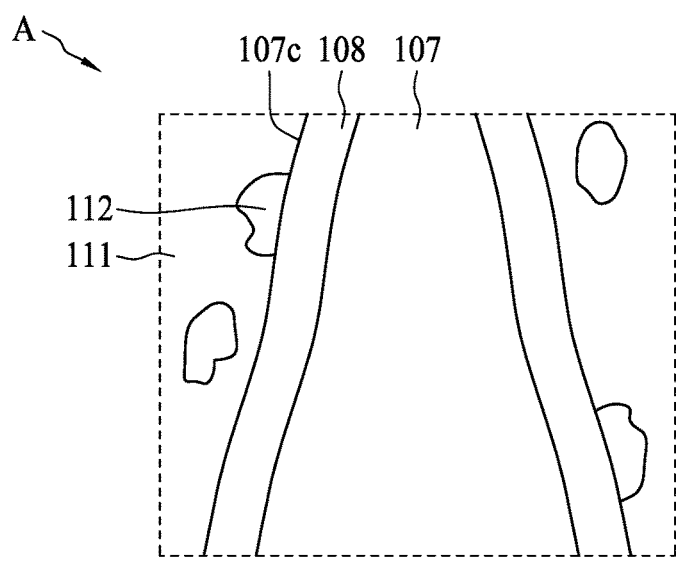
FIG. 1B illustrates an enlarged view of an area A of the semiconductor device package illustrated in FIG. 1A according to some embodiments of the present disclosure.

FIG. 1B illustrates an enlarged view of an area A of the conductive via 107 and the first encapsulant 111 of the semiconductor device package of FIG. 1A according to some embodiments of the present disclosure. In some embodiments, the first encapsulant 111 and the conductive via 107 are connected at a first interface 107c. The first interface 107c may be an uneven surface if a laser drilling technique is applied to form a via in the first encapsulant 111 for the conductive via 107. Due to the impact of the high power laser drilling, it may cause an uneven or rough surface when the laser goes through the first encapsulant 111. The rough or uneven surface of the first encapsulant 111 may improve the bonding effect between the first encapsulant 111 and the first seed layer 108 depositing thereon by providing more reaction sites on the surface. The first encapsulant 111 may include fillers. In some embodiments where a laser drilling is applied and the first encapsulant 111 includes fillers 112, the fillers at the first interface 107c are not intact in shape as they are damaged by it.

Figure 1C:
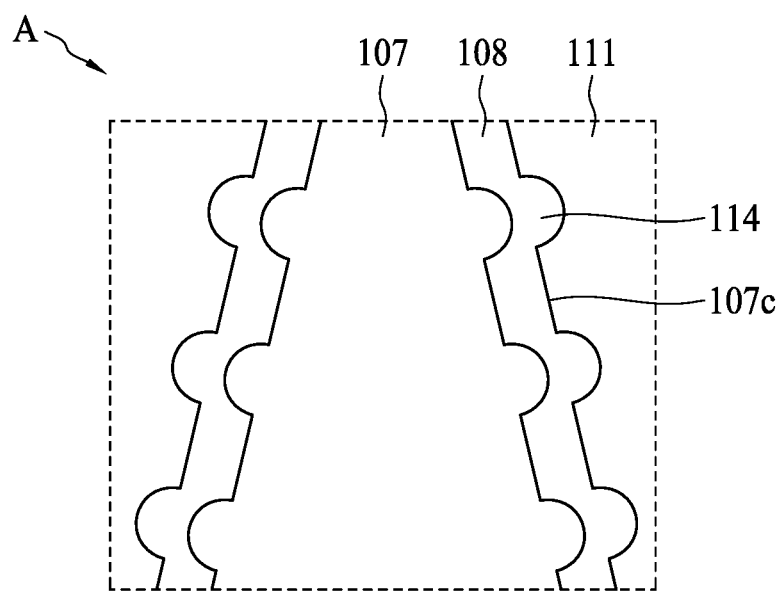
FIG. 1C illustrates an enlarged view of an area A of the semiconductor device package of FIG. 1A according to some embodiments of the present disclosure.

FIG. 1C illustrates an enlarged view of an area A of the conductive via 107 and the first encapsulant 111 of the semiconductor device package of FIG. 1A according to some embodiments of the present disclosure. The embodiments illustrated in FIG. 1C are different from those illustrated in FIG. 1B in that the laser power utilized in FIG. 1C is higher than that utilized in FIG. 1B (e.g., with smaller wavelength) so the fillers at the first interface 107c may be vaporized by such power and only recess 114 may be left at the first interface 107c. Due to the uneven surface caused by the laser drilling, the bonding effect between the first encapsulant 111 and the first seed layer 108 depositing thereon may be improved for the reasons described above.

Figure 1D:
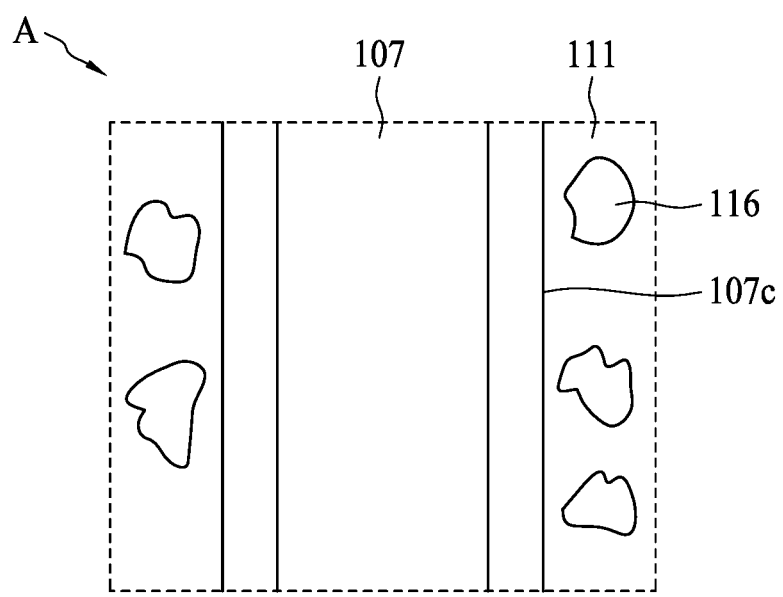
FIG. 1D illustrates an enlarged view of an area A of the semiconductor device package of FIG. 1A according to some embodiments of the present disclosure.

FIG. 1D illustrates an enlarged view of an area A of the conductive via 107 and the first encapsulant 111 of the semiconductor device package of FIG. 1A according to some embodiments of the present disclosure. The embodiments illustrated in FIG. 1D are different from those illustrated in FIG. 1A in that the first encapsulant 111 is drilled by a mechanical drilling technique, rather than a laser drilling technique so the fillers 116 may remain intact at the first interface 107c. Contrary to those fillers 112 that cannot remain intact in shape as they are damaged by a laser drilling process for forming the conductive via, the effect of the fillers 116, for example, in reducing stress or warpage of a resulting semiconductor package can be sustained.

Figure 2A:
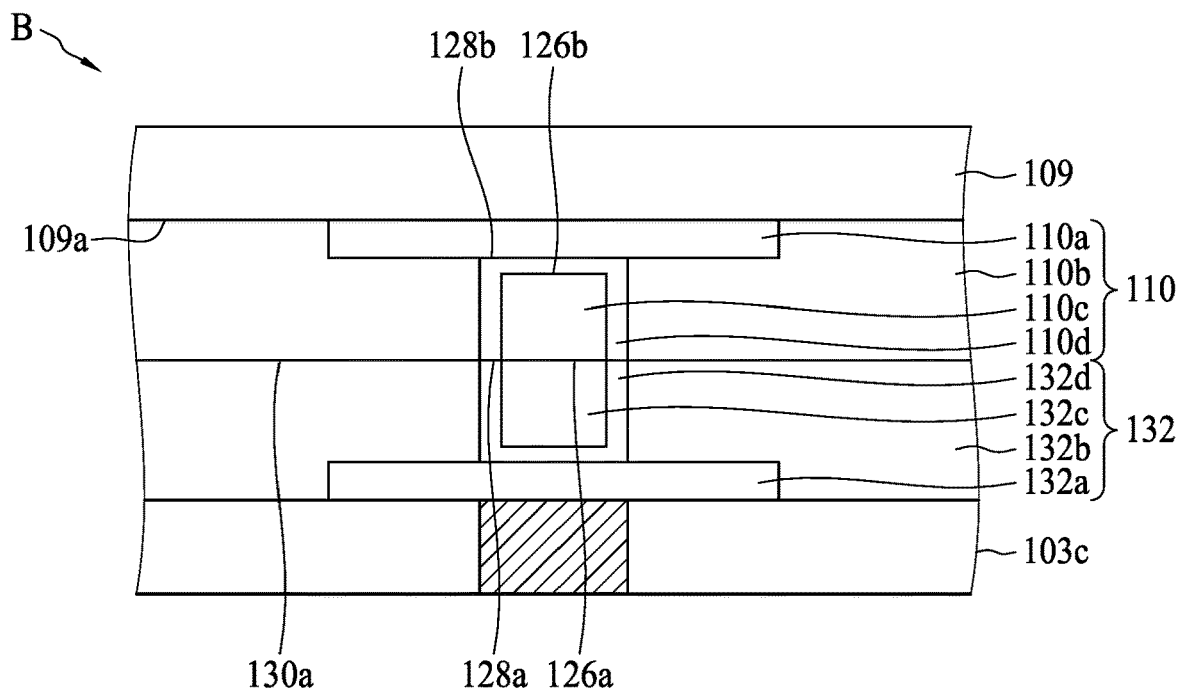
FIG. 2A illustrates an enlarged view of an area B of the semiconductor device package of FIG. 1A according to some embodiments of the present disclosure.

FIG. 2A illustrates an enlarged view of an area B of the fourth conductive terminal 110 and the second conductive terminal 132 of the semiconductor device package 100 of FIG. 1A according to some embodiments of the present disclosure. The fourth conductive terminal 110 may electrically connect to the second conductive terminal 132. In some embodiments, such as those illustrated in FIG. 2A, the fourth conductive terminal 110 electrically connects to the second conductive terminal 132 by a hybrid bonding technique.

The fourth conductive terminal 110 is disposed adjacent to the second active surface 109a of the second semiconductor element 109. In some embodiments, the fourth conductive terminal 110 electrically connects to the second active surface 109a of the second semiconductor element 109. The fourth conductive terminal 110 may include a fourth bonding pad 110a, a fourth insulation layer 110b, a fourth electrical connector 110c, and a fourth metal layer 110d.

The fourth bonding pad 110a is disposed adjacent to the second active surface 109a of the second semiconductor element 109. In some embodiments, the fourth bonding pad 110a is disposed on (e.g., physical contact or embedded in and exposed by) the second active surface 109a of the second semiconductor element 109.

The fourth insulation layer 110b is disposed adjacent to the second active surface 109a of the second semiconductor element 109. In some embodiments, the fourth insulation layer 110b is disposed adjacent to the fourth bonding pad 110a. The fourth insulation layer 110b may define an opening and exposes at least a portion of the fourth bonding pad 110a.

The fourth metal layer 110d is disposed adjacent to the second active surface 109a of the second semiconductor element 109. In some embodiments, the fourth metal layer 110d is disposed adjacent to the fourth bonding pad 110a. In some embodiments, the fourth metal layer 110d is disposed within the opening defined by the fourth insulation layer 110b. The fourth metal layer 110d may define an opening for accommodating the fourth electrical connector 110c. In some embodiments, the fourth metal layer 110d surrounds the fourth electrical connector 110c. The fourth metal layer 110d may cover at least a portion of the fourth connector bottom surface 126b of the fourth electrical connector 110c.

The fourth metal layer 110d has a fourth metal top surface 128a and a fourth metal bottom surface 128b opposite to the fourth metal top surface 128a. In some embodiments, the fourth metal top surface 128a of the fourth metal layer 110d is substantially coplanar with the fourth insulation top surface 130a of the fourth insulation layer 110b. In some embodiments, the fourth metal top surface 128a of the fourth metal layer 110d is substantially coplanar with the fourth connector top surface 126a of the fourth electrical connector 110c. In some embodiments, the fourth metal top surface 128a of the fourth metal layer 110d is substantially coplanar with the fourth insulation top surface 130a of the fourth insulation layer 110b and the fourth connector top surface 126a of the fourth electrical connector 110c. The fourth metal layer 110d may be a metal seed layer.

The fourth electrical connector 110c is disposed adjacent to the fourth bonding pad 110a. The fourth electrical connector 110c has a fourth connector top surface 126a and a fourth connector bottom surface 126b opposite to the fourth connector top surface 126a. In some embodiments, the fourth electrical connector 110c is disposed within the opening defined by the fourth insulation layer 110b. In some embodiments, the fourth electrical connector 110c is disposed within the opening defined by the fourth metal layer 110d. In some embodiments, the fourth electrical connector 110c is disposed above the fourth bonding pad 110a. The fourth electrical connector 110c may be a conductive pillar structure, for example, a copper pillar.

By disposing the fourth metal layer 110d as having a fourth metal top surface 128a substantially coplanar with the fourth insulation top surface 130a of the fourth insulation layer 110b, the bonding effect of the fourth conductive terminal 110 can be improved as the fourth metal top surface 128a and the fourth insulation top surface 130a would constitute a hybrid bonding interface which could improve the bonding strength more than an interface consisted of only one kind of material when bonding to a corresponding bonding structure (e.g., a corresponding hybrid bonding structure such as the second conductive terminal 132). In addition, the fourth metal layer 110d may enhance the ability of the fourth electrical connector 110c to resist lateral stress occurred during the formation of the structure, such as, during the bonding annealing process as the fourth metal layer 110d typically has a higher coefficient of thermal expansion (CTE) than the fourth insulation layer 110b because of the difference in the materials.

The second conductive terminal 132 may be embedded in and exposed by the first top RDL dielectric layer 118a. The second conductive terminal 132 may correspond to the fourth conductive terminal 110. The second conductive terminal 132 may include a second bonding pad 132a, a second insulation layer 132b, a second electrical connector 132c, and a second metal layer 132d. The second bonding pad 132a, the second insulation layer 132b, the second electrical connector 132c, and the second metal layer 132d are similar to those described for the fourth conductive terminal 110, which are not described repeatedly for brevity. The same fourth conductive terminal 110 may be applied to the first conductive terminal 102a illustrated in FIG. 1A and the same second conductive terminal 132 may be applied to the third conductive terminal 120b illustrated in FIG. 1A.

Figure 2B:
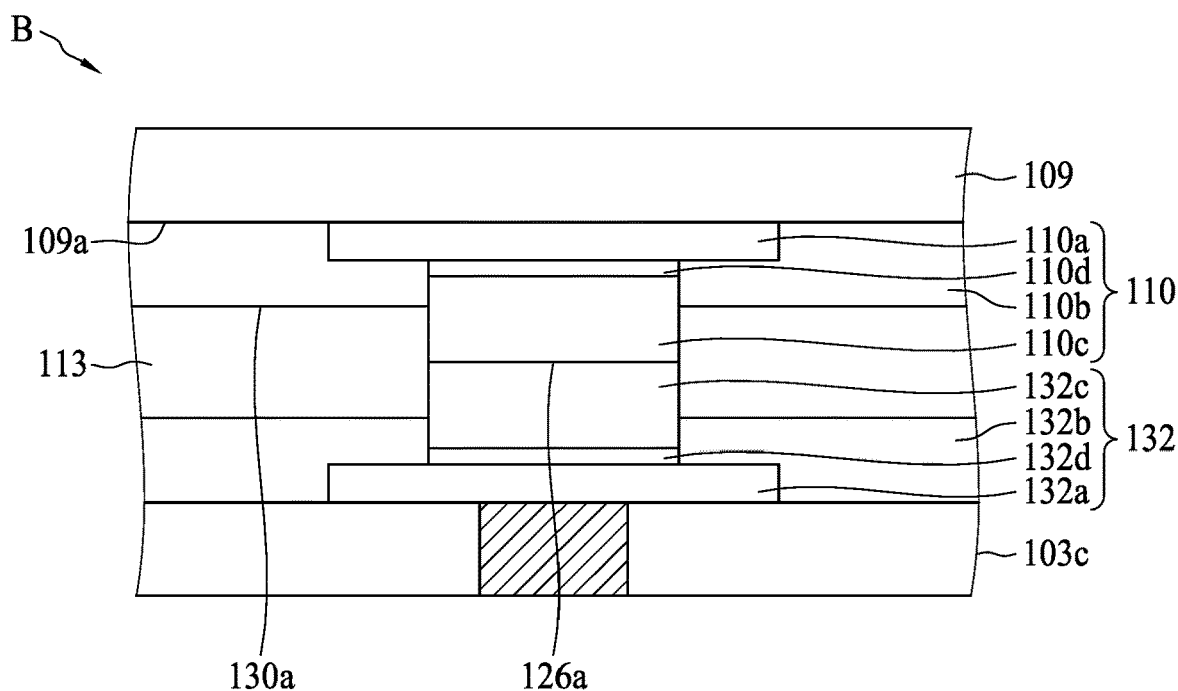
FIG. 2B illustrates an enlarged view of an area B of the semiconductor device package of FIG. 1A according to some embodiments of the present disclosure.

FIG. 2B illustrates an enlarged view of an area B of the fourth conductive terminal 110 and the second conductive terminal 132 of the semiconductor device package of FIG. 1A according to some embodiments of the present disclosure. The bonding structure illustrated in FIG. 2B is similar to that illustrated in FIG. 2A with a difference including that the bonding structure illustrated in FIG. 2B applies a copper to copper bonding technique, rather than a hybrid bonding technique. The fourth conductive terminal 110 and the second conductive terminal 132 illustrated in FIG. 2B are similar to those illustrated in FIG. 2A, with a difference including that the fourth metal layer 110d does not surround the fourth electrical connector 110c but the fourth insulation layer 110b does. In addition, the fourth insulation top surface 130a of the fourth insulation layer 110b and the fourth connector top surface 126a of the fourth electrical connector 110c are not in the same plane; and the fourth electrical connector 110c and the second electrical connector 132c may be surrounded by the second encapsulant 113.

The second conductive terminal 132 illustrated in FIG. 2B may correspond to the fourth conductive terminal 110 illustrated in FIG. 2B, the components of which are not described repeatedly for brevity. The same fourth conductive terminal 110 may be applied to the first conductive terminal 102a illustrated in FIG. 1A and the same second conductive terminal 132 may be applied to the third conductive terminal 120b illustrated in FIG. 1A.

The second semiconductor element 109 may electrically connect to and directly bond to the first RDL 103 by the hybrid bonding technique or copper to copper bonding technique as described above. By such technique, the second semiconductor element 109 may be successfully directly bonded to the first RDL 103 by a flip-chip technique without utilizing a solder bump/stud. Therefore, the signal speed may be faster as the hybrid bonding technique allows the second semiconductor element 109 to directly bond to the first RDL 103, which provides a shorter transmission path than a semiconductor element that is bonded to a RDL by a wire bonding technique. In addition, the hybrid bonding technique may avoid the problems that may be caused by using a solder stud/bump, such as a solder contamination problem because of the solder overflow or a RC delay problem caused by the intermetallic coverage between the solder material and other metals.

Moreover, since the second semiconductor element 109 can be successfully bonded to the first RDL 103 by a flip-chip technique by hybrid bonding, the second semiconductor element 109 and the second encapsulant 113 can be thinner by reducing the thickness from the second back surface 109b of the second semiconductor element 109, which may further reduce the size of the whole package. Therefore, compared to a semiconductor element that is bonded to a RDL by a wire bonding technique, the semiconductor device package of the present disclosure may be thinner.

In addition, the exposed second back surface 109b of the second semiconductor element 109 may improve the heat dissipation effect and provide flexibility for further attachment of a heat sink to improve the heat dissipation effect more. Moreover, since the hybrid bonding requires less surface area than wire bonding, the electrical connections per surface area can be increased by the hybrid bonding.

Figure 3:
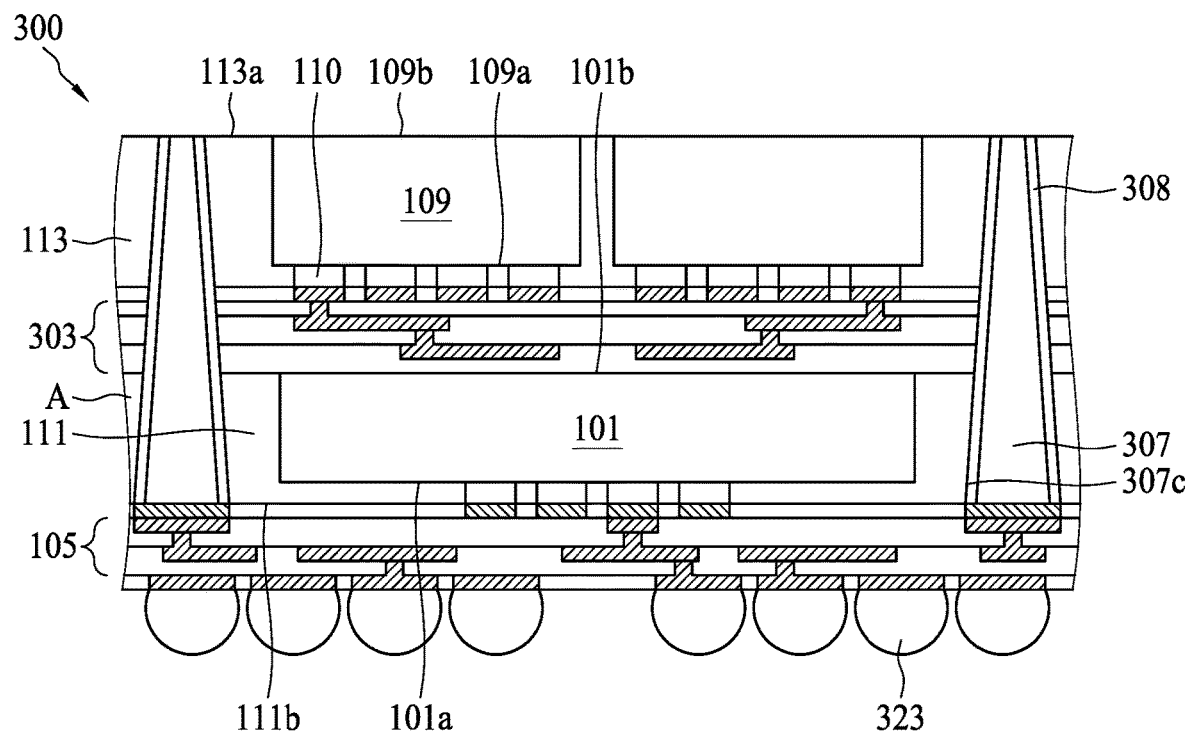
FIG. 3 illustrates a cross-sectional view of a semiconductor device package according to some embodiments of the present disclosure.

FIG. 3 illustrates a cross-sectional view of a semiconductor device package 300 according to some embodiments of the present disclosure. The semiconductor device package 300 is similar to that illustrated in FIG. 1A, with a difference including that the conductive via 307 extends from the second encapsulant top surface 113a of the second encapsulant 113 to the first encapsulant bottom surface 111b of the first encapsulant 111 so an electrical signal can be transmitted from one side of the second encapsulant 113 to one side of the first encapsulant 111. In addition, the first seed layer 308 covers at least a portion of the first interface 107c between the first encapsulant 111 and the conductive via 307. In some embodiments, the first seed layer 308 is disposed in conformity with the first interface 107c.

Figure 4:
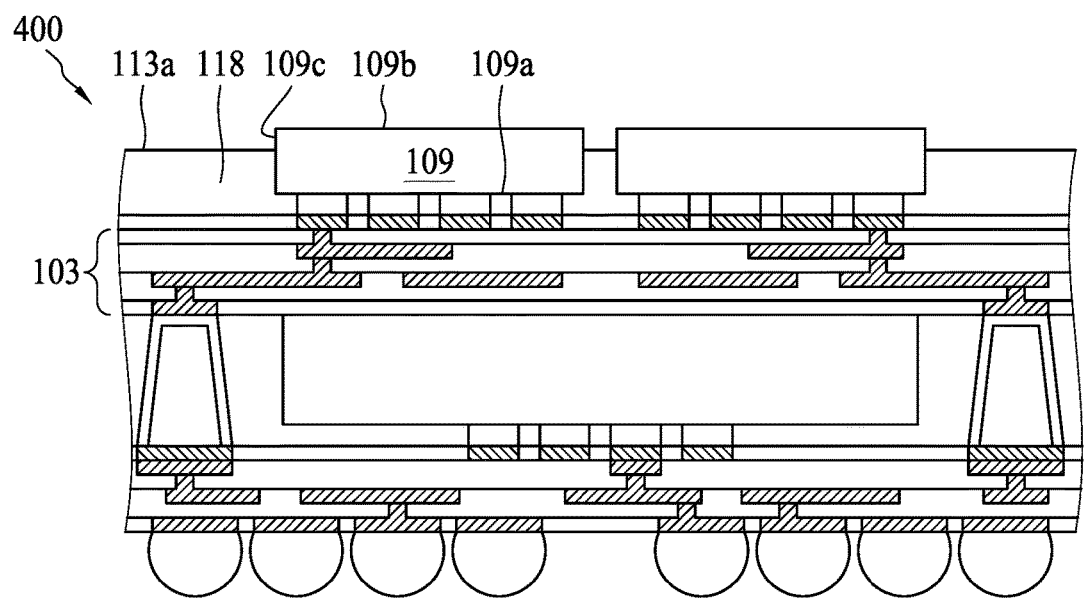
FIG. 4 illustrates a cross-sectional view of a semiconductor device package according to some embodiments of the present disclosure.

FIG. 4 illustrates a cross-sectional view of a semiconductor device package 400 according to some embodiments of the present disclosure. The semiconductor device package 400 is similar to that illustrated in FIG. 1A, with a difference including that the second encapsulant top surface 113a of the second encapsulant 113 is not in the same plane with the second back surface 109b of the second semiconductor element 109, which exposes at least a portion of the side surface 109c of the second semiconductor element 109. Such exposure may improve the heat dissipation effect. In some embodiments, the second back surface 109b of the second semiconductor element 109 protrudes from the second encapsulant top surface 113a of the second encapsulant 113.

In some embodiments, the present disclosure provides a method of manufacturing a semiconductor device package including: providing a first semiconductor element; disposing a first redistribution layer adjacent to a first active surface of the first semiconductor element; disposing a second semiconductor element adjacent to the first redistribution layer, wherein a second back surface of the second semiconductor element faces the first redistribution layer; molding the second semiconductor element to form a first encapsulant; forming a conductive via in the first encapsulant; and disposing a second redistribution layer adjacent to a second active surface of the second semiconductor element. According to the method of the present disclosure, a semiconductor device package that can include a conductive via having a higher aspect ratio compared to a conventional one, which in turn results in a higher I/Os, and a semiconductor device package that can achieve superior advantages of a flip-chip technique, including higher I/Os, superior heat dissipation effect and flexibility for further improvement, and reduction of package size, and advantages of a solder-free technique including reducing solder contamination possibilities may be successfully obtained.

Figure 5A:
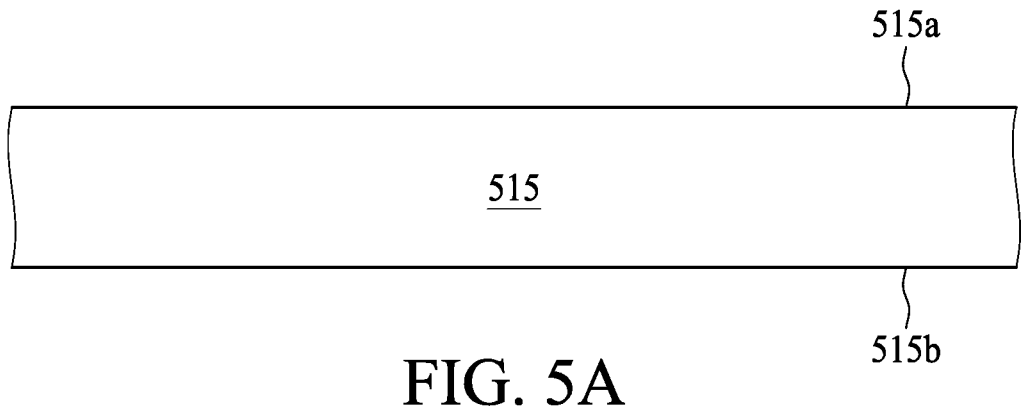
FIG. 5A, FIG. 5B, FIG. 5C, FIG. 5D, FIG. 5E, FIG. 5F, FIG. 5G, FIG. 5H, FIG. 5I, FIG. 5J, FIG. 5K, FIG. 5L, FIG. 5M, FIG. 5N, FIG. 5O, FIG. 5P, and FIG. 5Q illustrate a method of manufacturing a semiconductor device package such as the semiconductor device package of FIG. 1A.
Figure 5B:
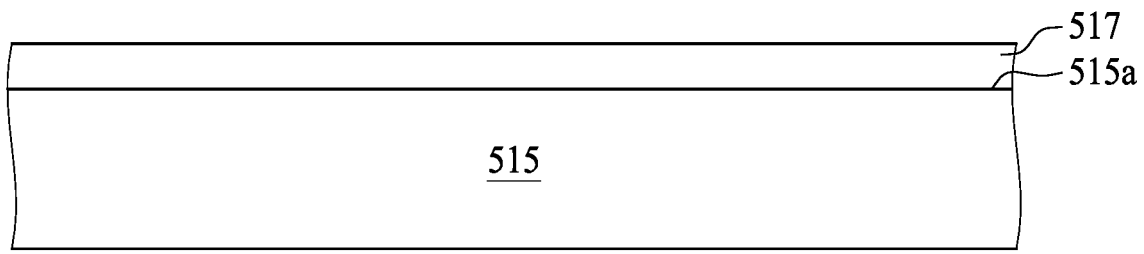
Figure 5C:
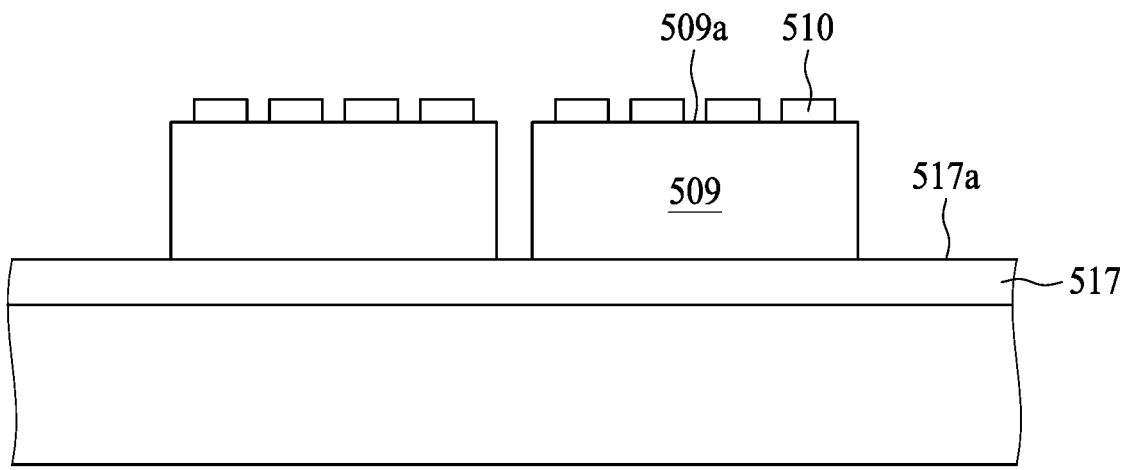
Figure 5D:
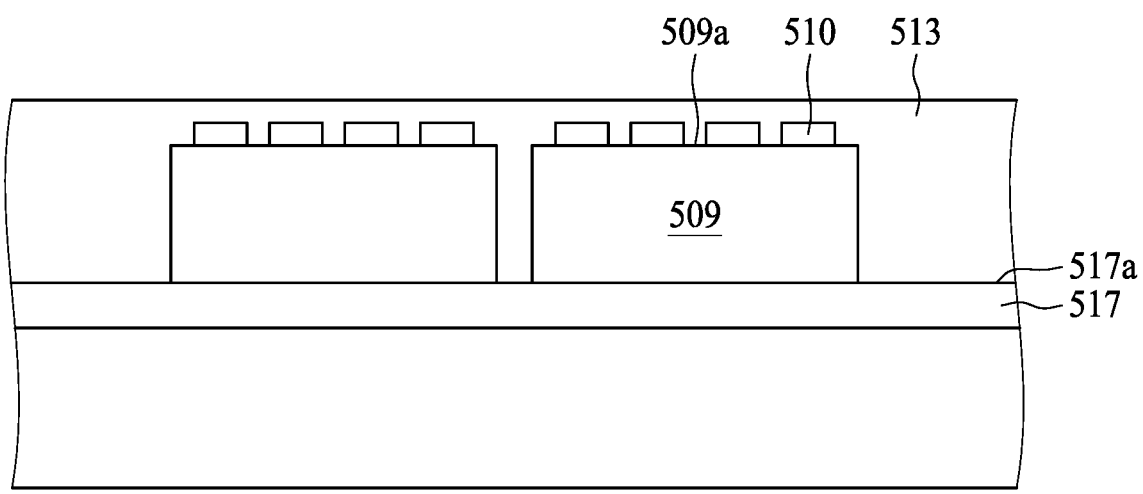
Figure 5E:
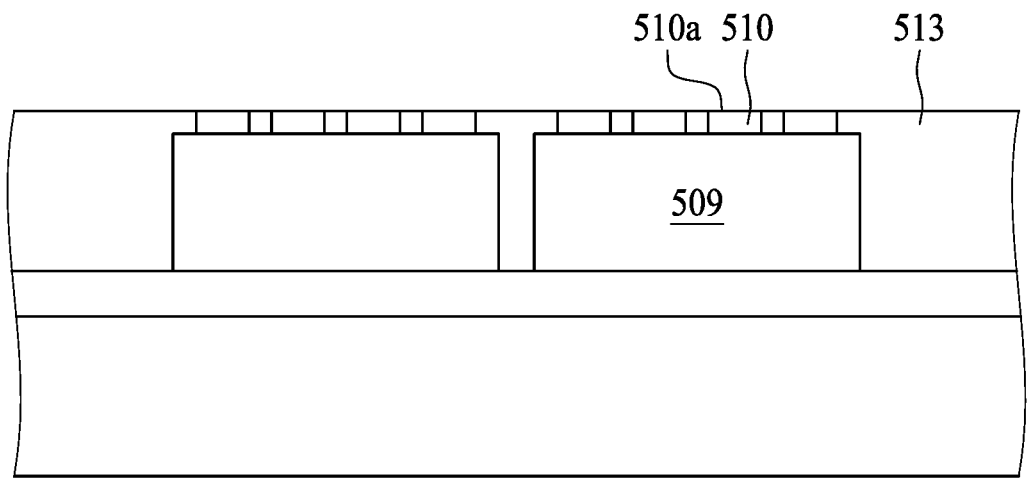
Figure 5F:
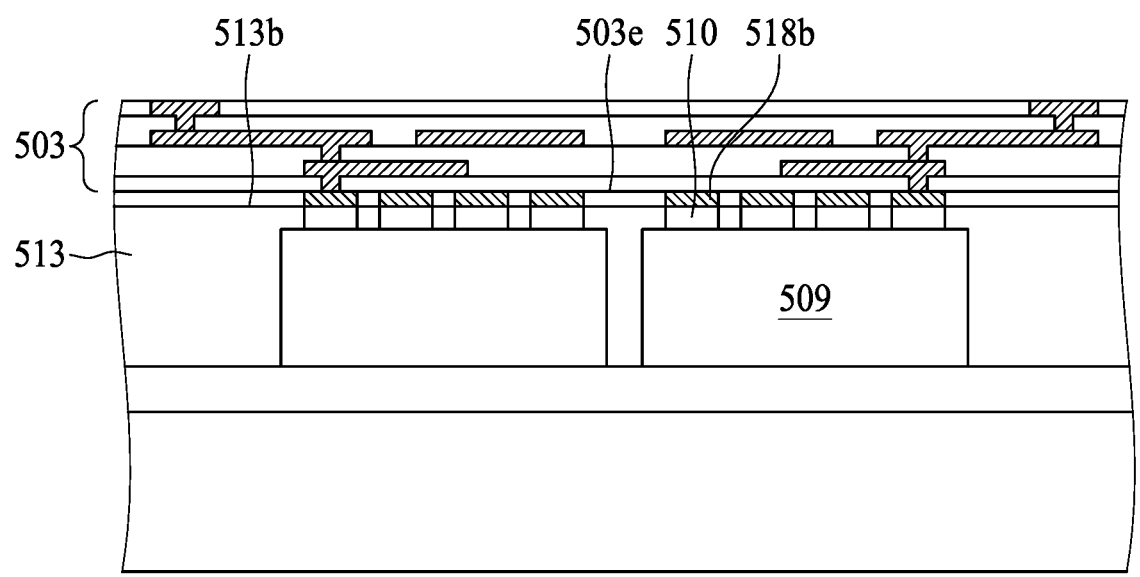
Figure 5G:
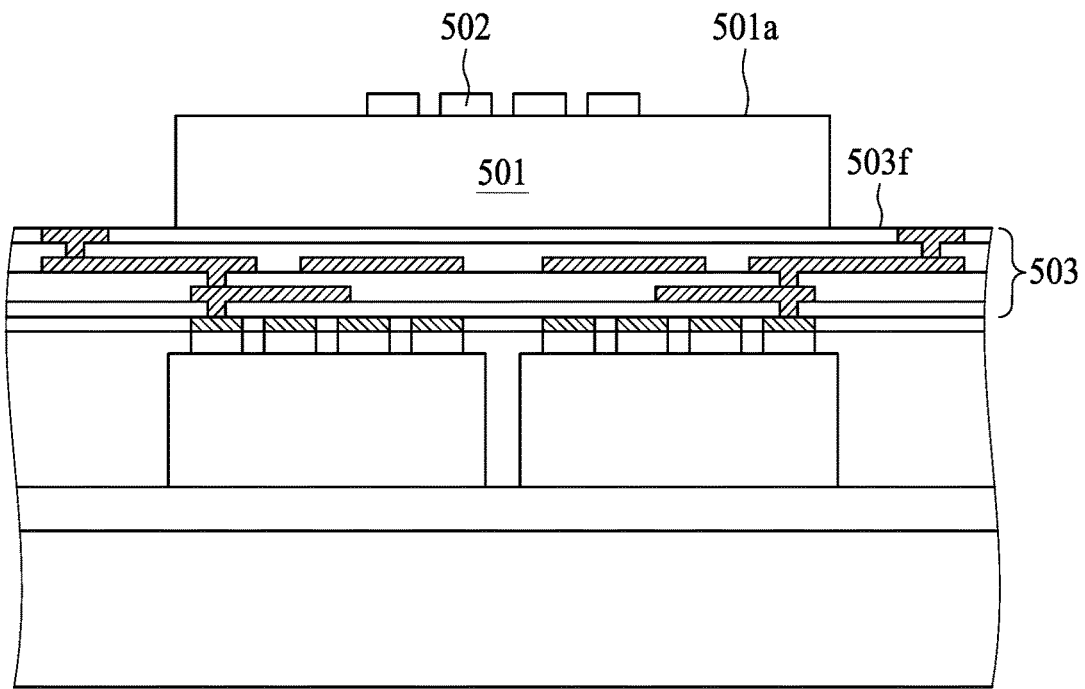
Figure 5H:
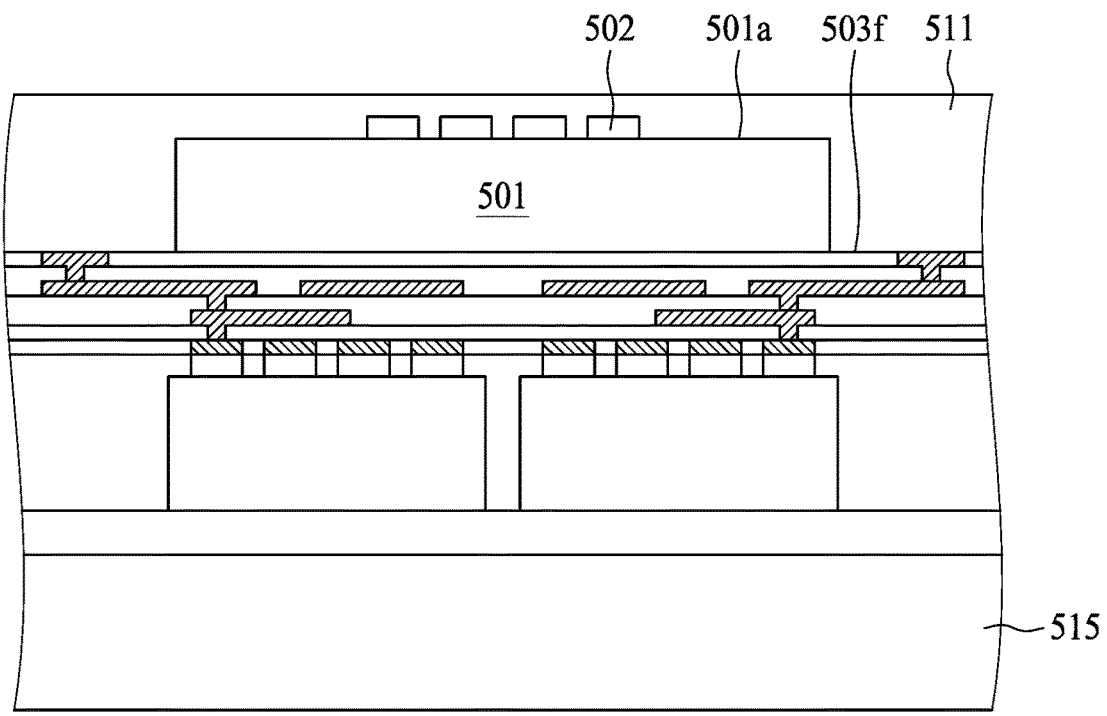
Figure 5I:
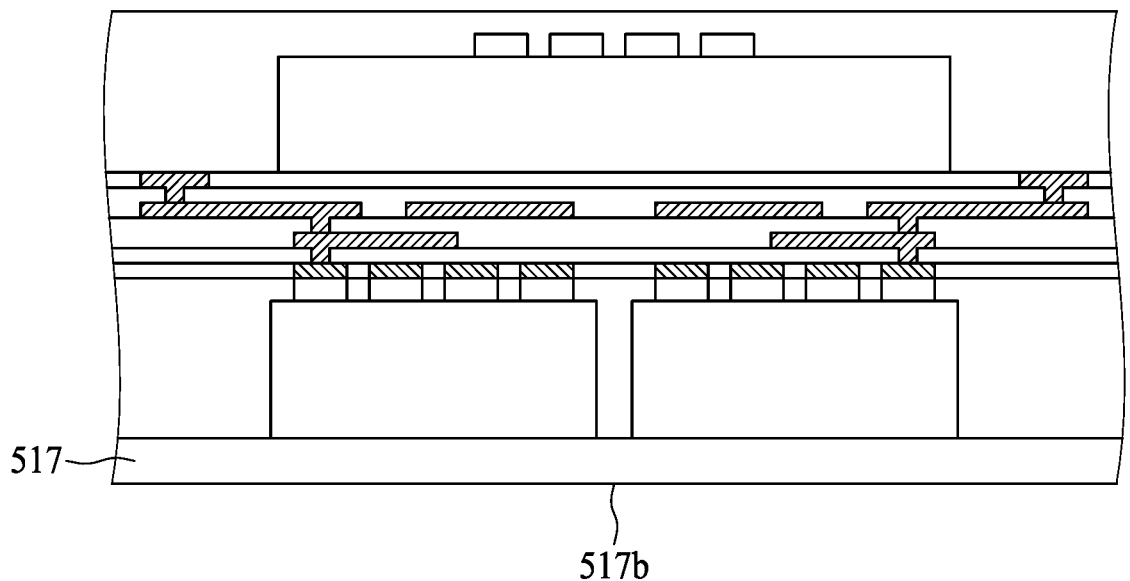
Figure 5J:
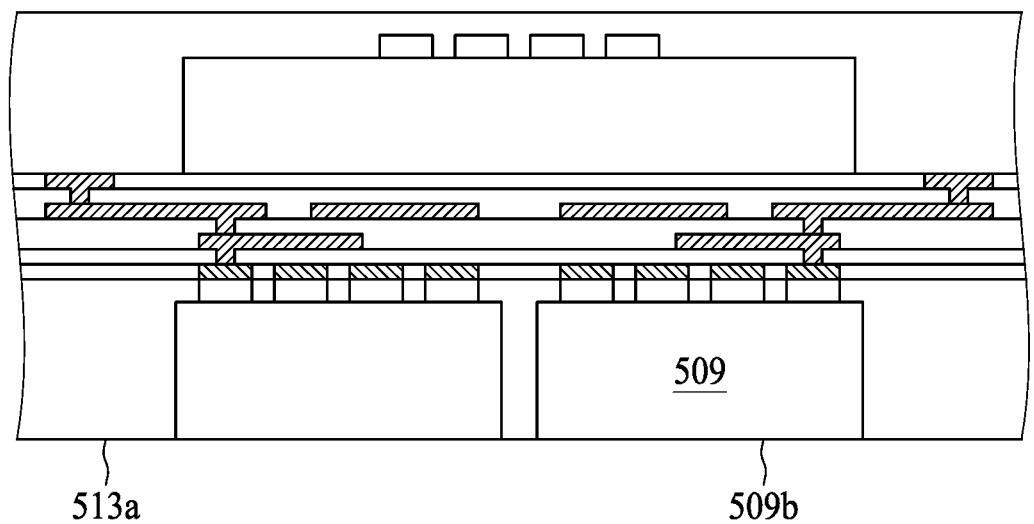
Figure 5K:
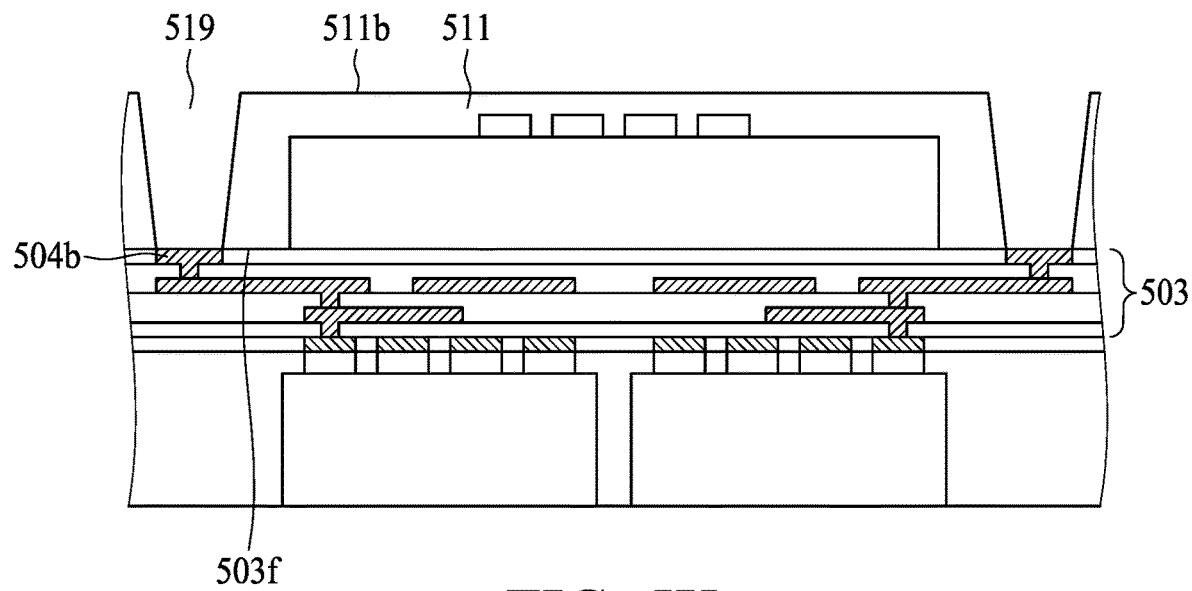
Figure 5L:
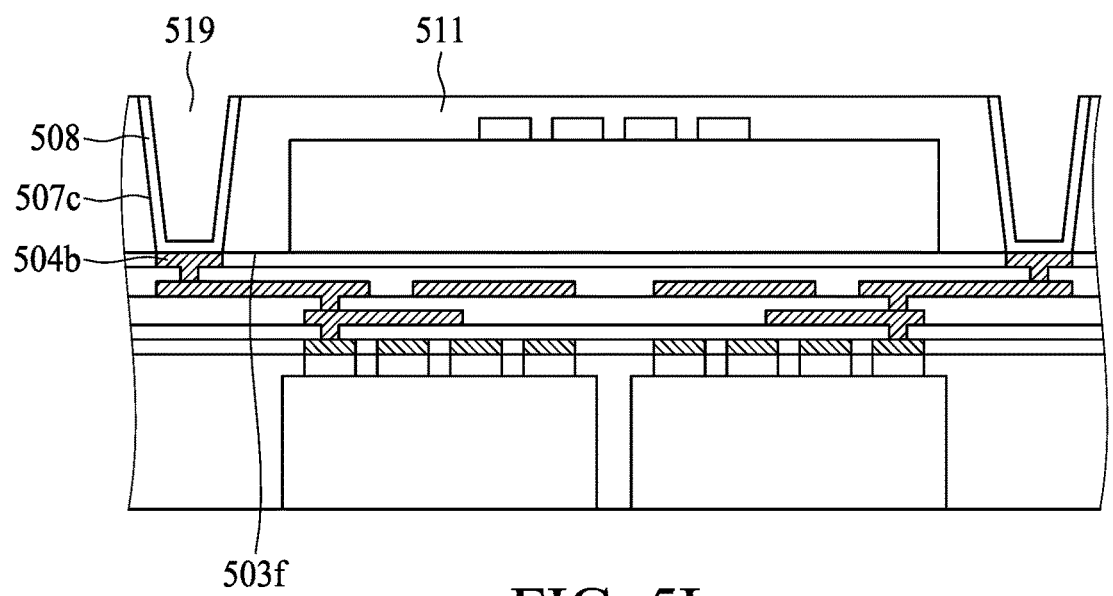
Figure 5M:
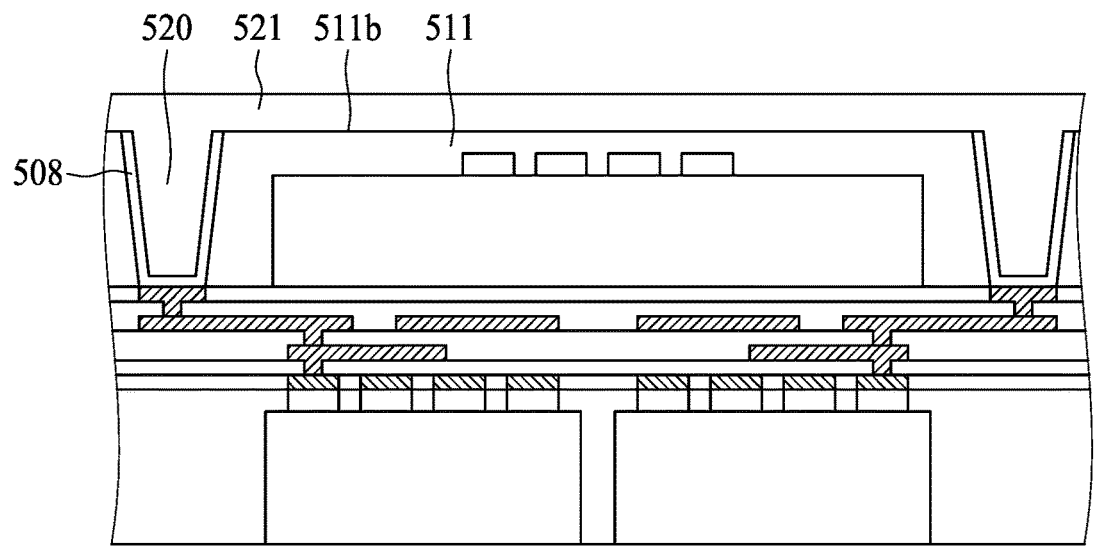
Figure 5N:
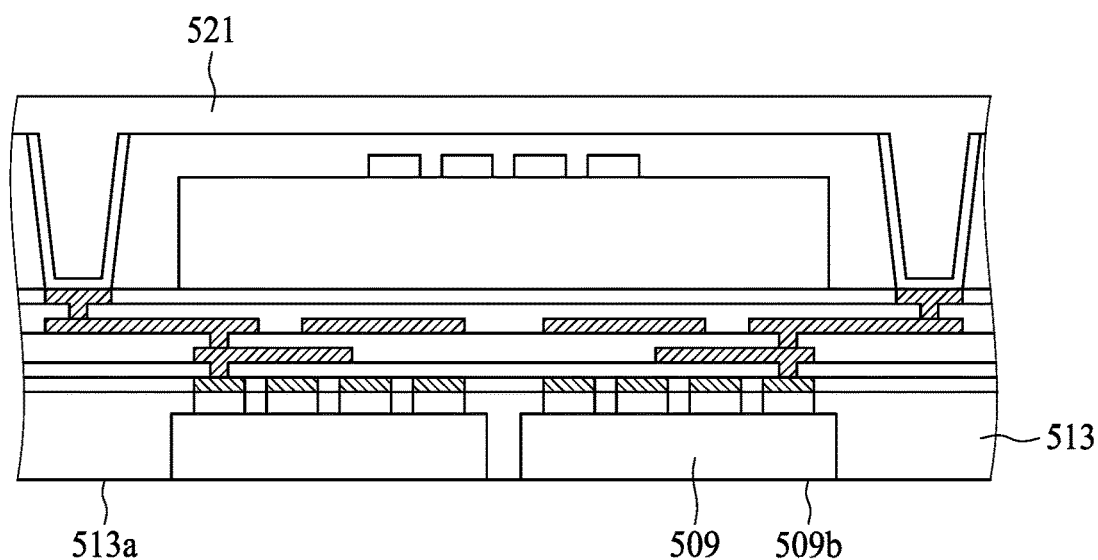
Figure 5O:
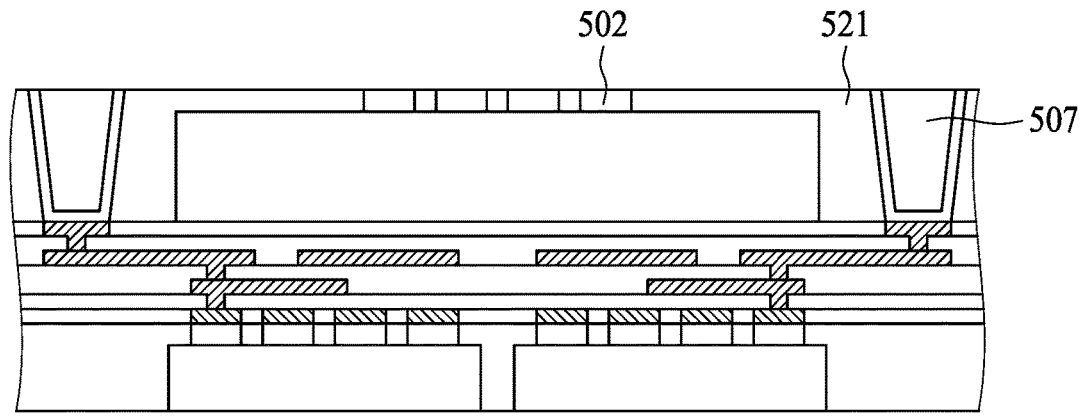
Figure 5P:
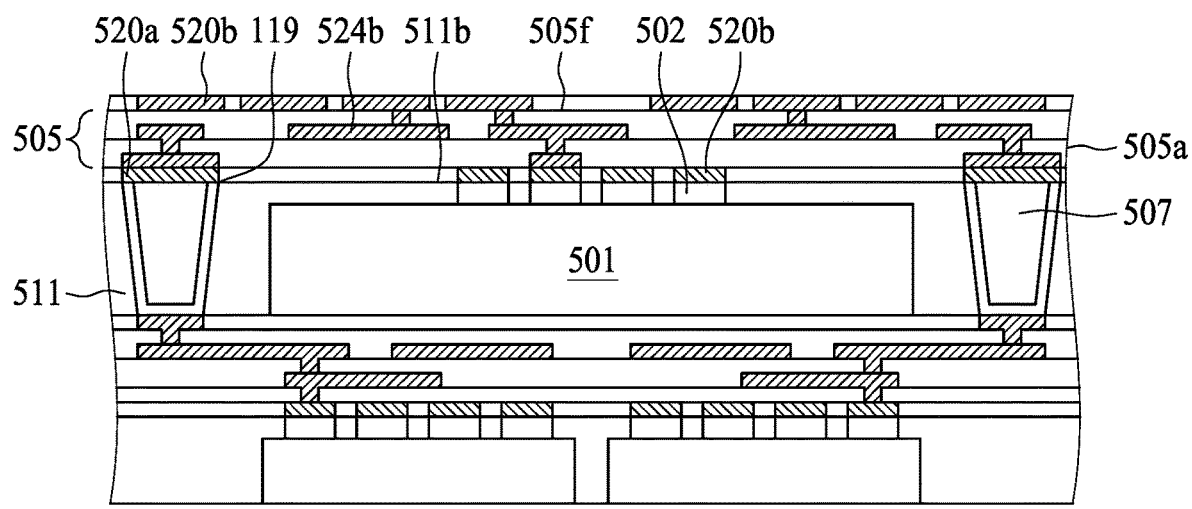
Figure 5Q:
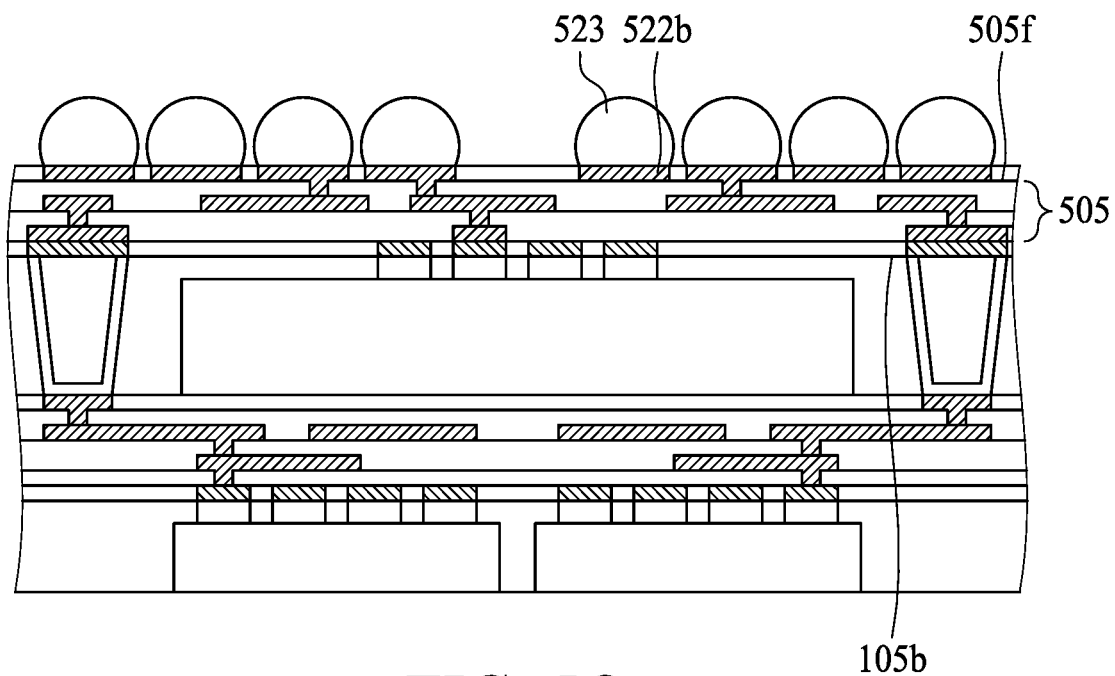

FIGS. 5A-5Q illustrate a method of manufacturing a semiconductor device package such as the semiconductor device package of FIG. 1A.

Referring to FIG. 5A, a carrier 515 is provided. The carrier 515 has a first carrier surface 515a and a second carrier surface 515b opposite to the first carrier surface 515a.

Referring to FIG. 5B, a release layer 517 is disposed adjacent to the first carrier surface 515a of the carrier 515. The release layer 517 may be disposed with a lamination technique, a coating technique, or other suitable process.

Referring to FIG. 5C, at least one first semiconductor element 509 is disposed adjacent to a release top surface 517a of the release layer 517. At least one first conductive terminal 510 is disposed on the first active surface 509a of the first semiconductor element 509. The first conductive terminal 510 may be a hybrid bonding structure or a copper to copper bonding structure. In some embodiments, the first conductive terminal 510 is formed by, for example, a combination of a physical vapor deposition, plating, photolithography, etching, lamination (or deposition), or other suitable processes.

Referring to FIG. 5D, a first encapsulant 513 is disposed adjacent to a release top surface 517a of the release layer 517. The first encapsulant 513 may cover at least a portion of the release top surface 517a of the release layer 517, at least a portion of the first conductive terminal 510, and at least a portion of the first active surface 509a of the first semiconductor element 509. In some embodiments, the first encapsulant 513 covers the first conductive terminal 510 and the first semiconductor element 509 entirely (e.g., the first semiconductor element 509 is embedded in the first encapsulant 513). The first encapsulant 513 may be formed by, for example, a molding technique.

Referring to FIG. 5E, a portion of the first encapsulant 513 is removed until at least a portion of the first conductive top surface 510a of the first conductive terminal 510 is exposed. The first encapsulant 513 may be removed by, for example, a grinding technique, a polishing technique, an etching technique, or other suitable processes.

Referring to FIG. 5F, a first RDL 503 is disposed adjacent to the first encapsulant bottom surface 513b of the first encapsulant 513. The first RDL 503 may be disposed by a combination of a lamination technique, a photolithography technique, a plating technique, and an etching technique. At least one second conductive terminal 518b is disposed adjacent to a first top surface 503e of the first RDL 503 for external electrical connection. The second conductive terminal 518b may be a hybrid bonding structure or a copper to copper bonding structure.

Referring to FIG. 5G, at least one second semiconductor element 501 is disposed adjacent to a first bottom surface 503f of the first RDL 503. At least one third conductive terminal 502 is disposed on the second active surface 501a of the second semiconductor element 501. The third conductive terminal 502 may be a hybrid bonding structure or a copper to copper bonding structure. In some embodiments, the third conductive terminal 502 is formed by, for example, a combination of a physical vapor deposition, plating, photolithography, etching, lamination (or deposition), or other suitable processes.

Referring to FIG. 5H, a second encapsulant 511 is disposed adjacent to the first top surface 503f of the first RDL 503. The second encapsulant 511 may cover at least a portion of the second conductive terminal 502 and at least a portion of the second active surface 501a of the second semiconductor element 501. In some embodiments, the second encapsulant 511 covers the second conductive terminal 502 and the second semiconductor element 501 entirely (e.g., the second semiconductor element 501 is embedded in the second encapsulant 511). The second encapsulant 511 may be formed by, for example, a molding technique.

Referring to FIG. 5I, the carrier 515 is removed completely, which should expose the release back surface 517b of the release layer 517. The carrier 515 may be removed by, for example, a grinding technique, a polishing technique, an etching technique, or other suitable processes.

Referring to FIG. 5J, the release layer 517 is removed completely, which should expose the first back surface 509b of the first semiconductor element 509 and the first encapsulant top surface 513a of the first encapsulant 513. The release layer 517 may be removed by, for example, a grinding technique, a polishing technique, an etching technique, or other suitable processes.

Referring to FIG. 5K, a laser drilling process is performed from the second encapsulant bottom surface 511b of the second encapsulant 511 toward the first bottom surface 503f of the first RDL 503 to form a via 519 exposing at least a portion of the first bottom RDL conductive trace 504b of the first RDL 503.

Referring to FIG. 5L, a first seed layer 508 is disposed on the sidewall 507c of the via 519 of the second encapsulant 511 and on at least a portion of the exposed portion of the first bottom RDL conductive trace 504b of the first RDL 503. In some embodiments, the first seed layer 508 is disposed in conformity with the shape of the via 519. The first seed layer 508 may be disposed by a plating technique, a physical vapor deposition technique, or other suitable process.

Referring to FIG. 5M, a conductive layer 521 is disposed in the opening 520 defined by the first seed layer 508 and on at least a portion of the second encapsulant bottom surface 511b of the second encapsulant 511. The conductive layer 521 may fill the opening 520 and cover the first seed layer 508. The conductive layer 521 may be disposed by, for example, a plating technique such as electroplating, or other suitable process.

Referring to FIG. 5N, the first encapsulant 513 and the first semiconductor element 509 may be thinned from the first encapsulant top surface 513a of the first encapsulant 513 and the first back surface 509b of the first semiconductor element 509. The thinning process may be performed by, for example, a grinding technique, a polishing technique, or other suitable process.

Referring to FIG. 5O, a portion of the conductive layer 521 is removed until at least a portion of the second conductive terminal 502 is exposed. In addition, a conductive via 507 may be formed. The conductive layer 521 may be removed by, for example, a grinding technique, a polishing technique, an etching technique, or other suitable processes.

Referring to FIG. 5P, a second RDL 505 is disposed adjacent to the second encapsulant bottom surface 511b of the second encapsulant 511. The second RDL 505 may be disposed by a combination of a lamination technique, a photolithography technique, a plating technique, and an etching technique. At least one fourth conductive terminal 520b is disposed adjacent to the second encapsulant bottom surface 511b of the second encapsulant 511 for external electrical connection. The fourth conductive terminal 520b may be a hybrid bonding structure or a copper to copper bonding structure. In some embodiments, the second RDL 505 electrically connects to and directly bonds to the second semiconductor element 501 through a hybrid bonding or a copper to copper bonding between the fourth conductive terminal 520b and the third conductive terminal 502. In some embodiments, the fourth conductive terminal 520b is formed by, for example, a combination of a physical vapor deposition, plating, photolithography, etching, lamination (or deposition), or other suitable processes.

Referring to FIG. 5Q, at least one electrical connector 523 is disposed adjacent to the second bottom surface 505f of the second RDL 505. In some embodiments, the electrical connector 523 is disposed on (e.g., physical contact or embedded in and exposed by) the portion of the bonding pad 522b exposed from the second bottom surface 505f of the second RDL 505 for electrical external connection. The electrical connector 523 may be a solder ball, which may be formed by, for example, a solder ball placement technique or a solder paste printing technique, followed by a reflowing technique. Subsequently, a semiconductor device package (e.g., a semiconductor package 100 as is illustrated in FIG. 1A) may be obtained.

Figure 6A:
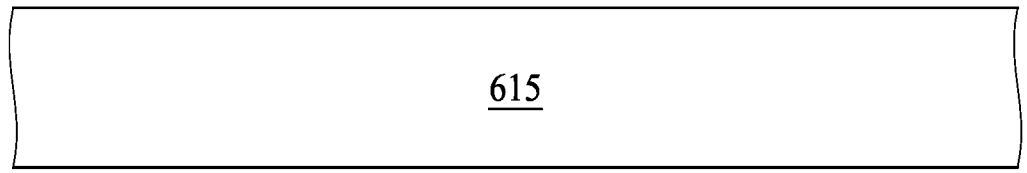
FIG. 6A, FIG. 6B, FIG. 6C, FIG. 6D, FIG. 6E, FIG. 6F, FIG. 6G, FIG. 6H, FIG. 6I, FIG. 6J, FIG. 6K, FIG. 6L, FIG. 6M, FIG. 6N, and FIG. 6O illustrate a method of manufacturing a semiconductor device package such as the semiconductor device package of FIG. 3.
Figure 6B:
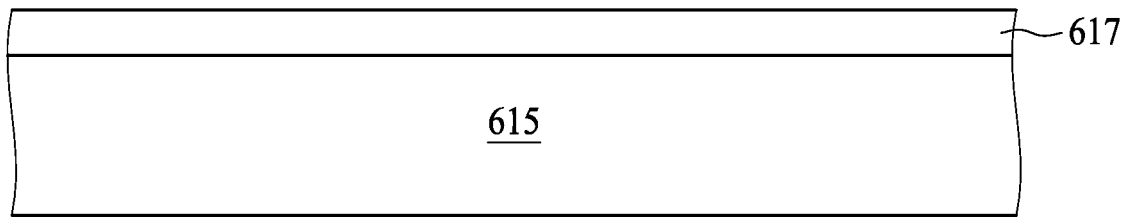
Figure 6C:
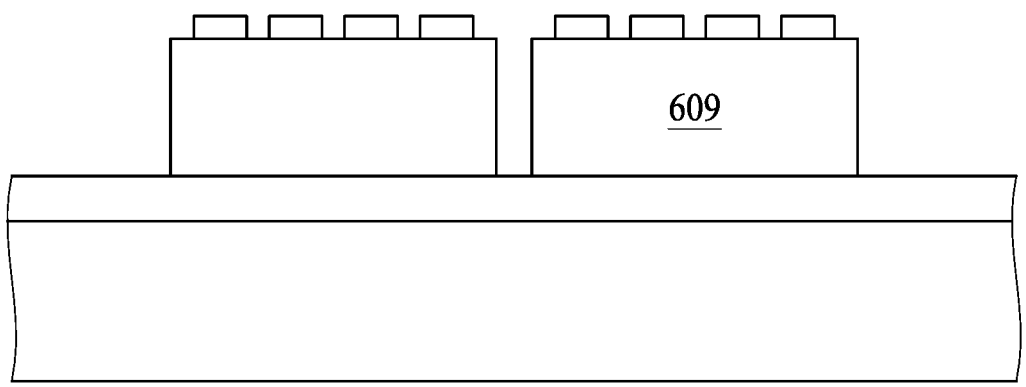
Figure 6D:
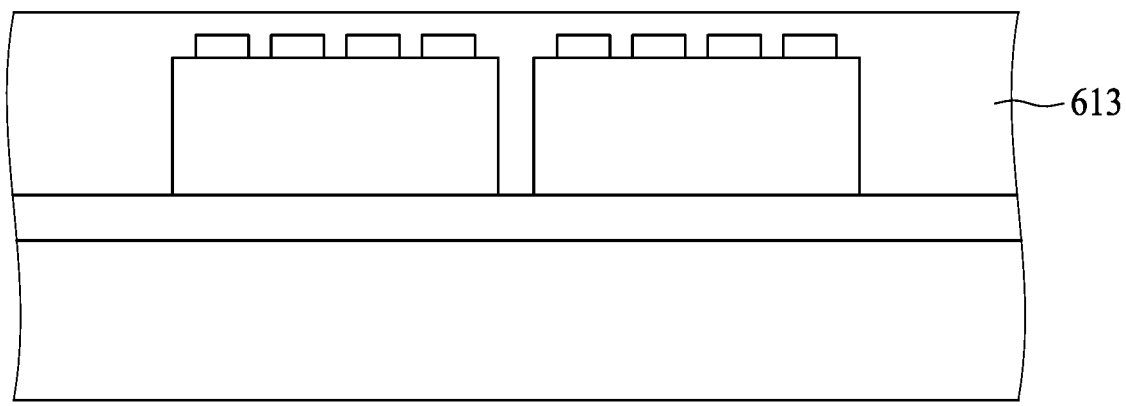
Figure 6E:
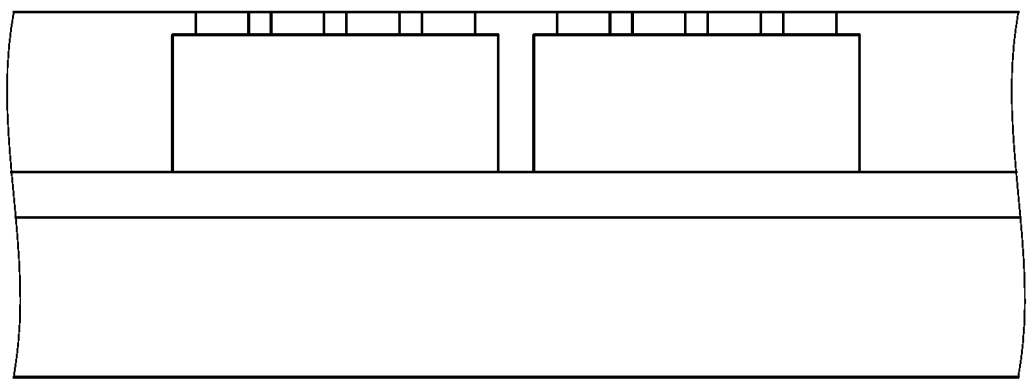
Figure 6F:
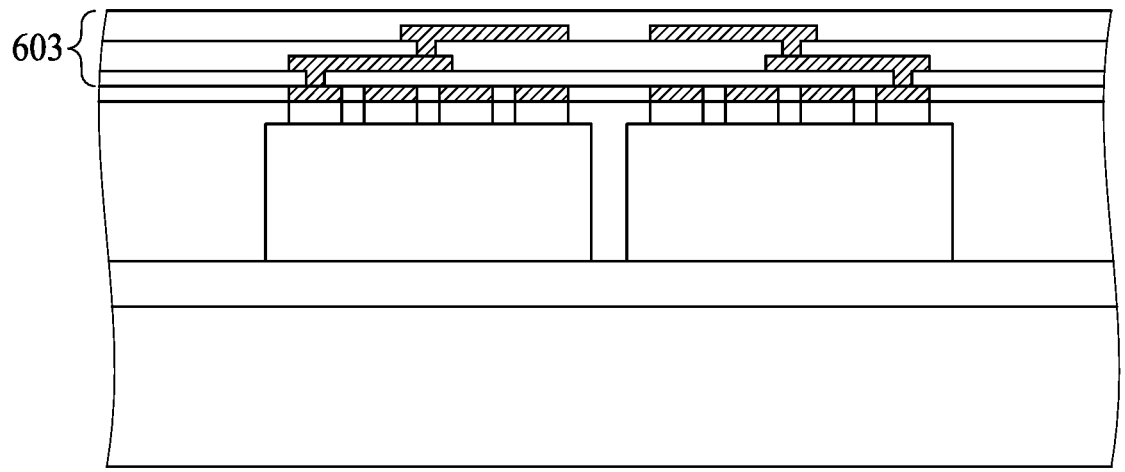
Figure 6G:
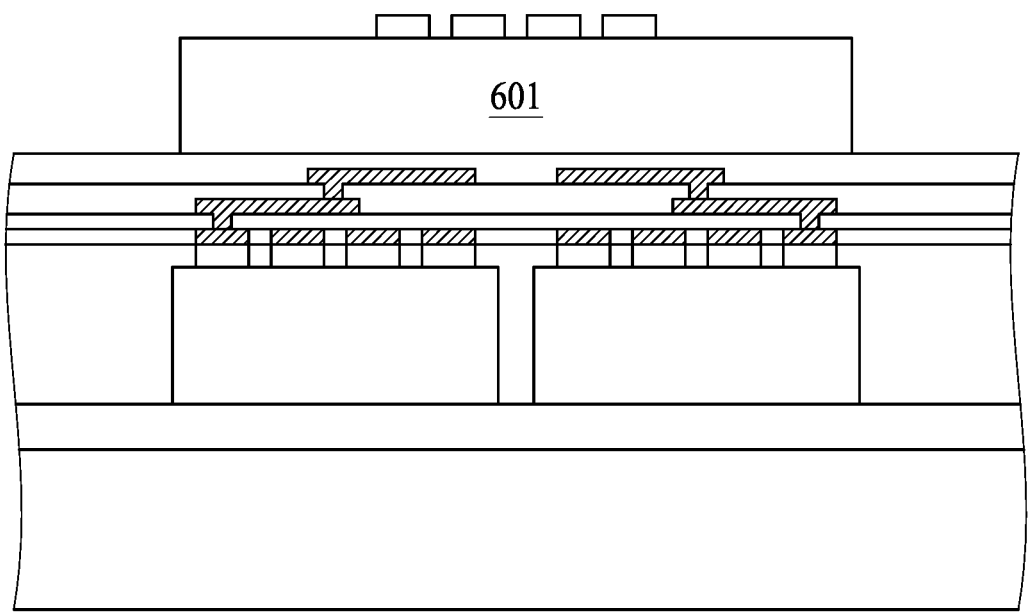
Figure 6H:
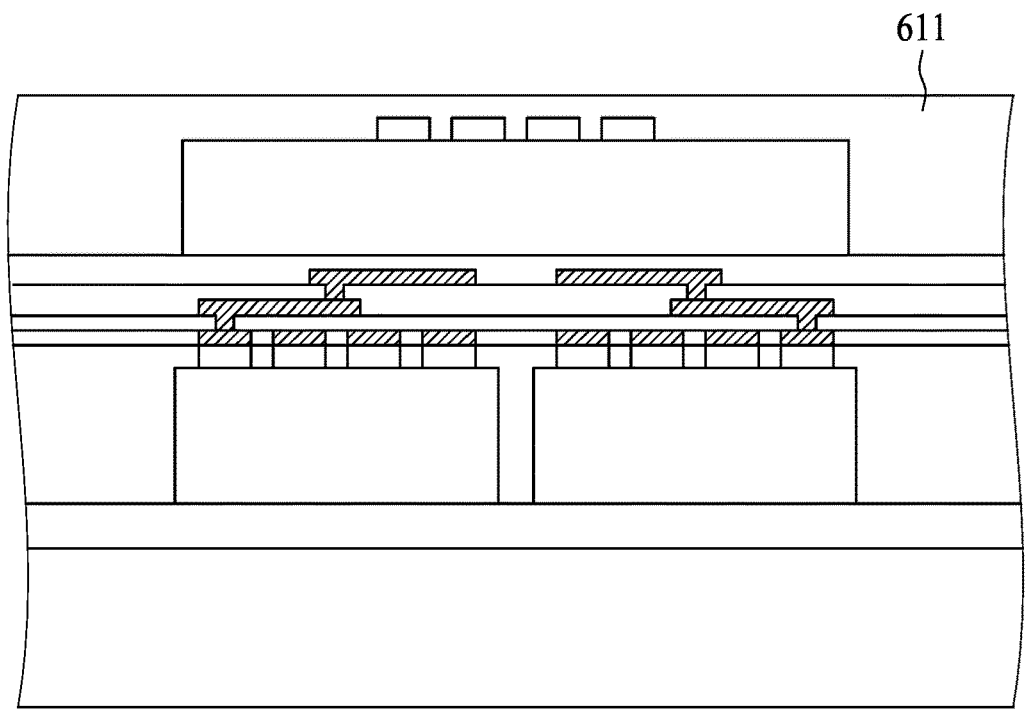
Figure 6I:
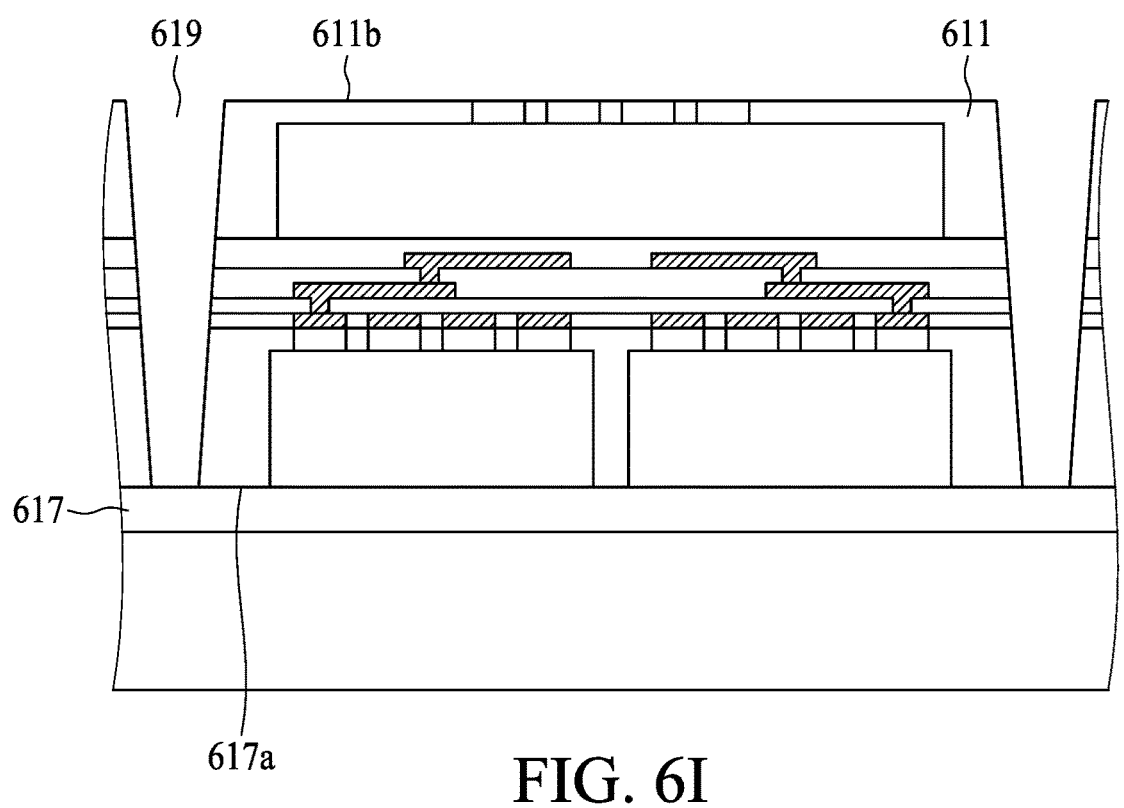
Figure 6J:
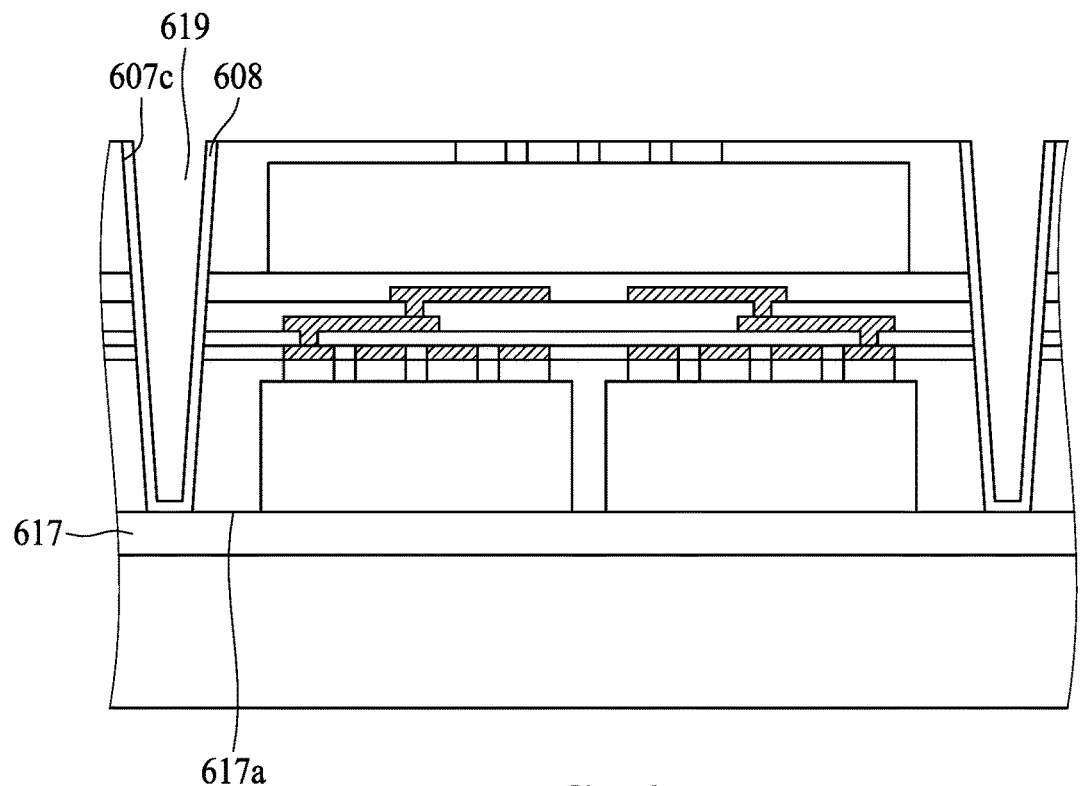
Figure 6K:
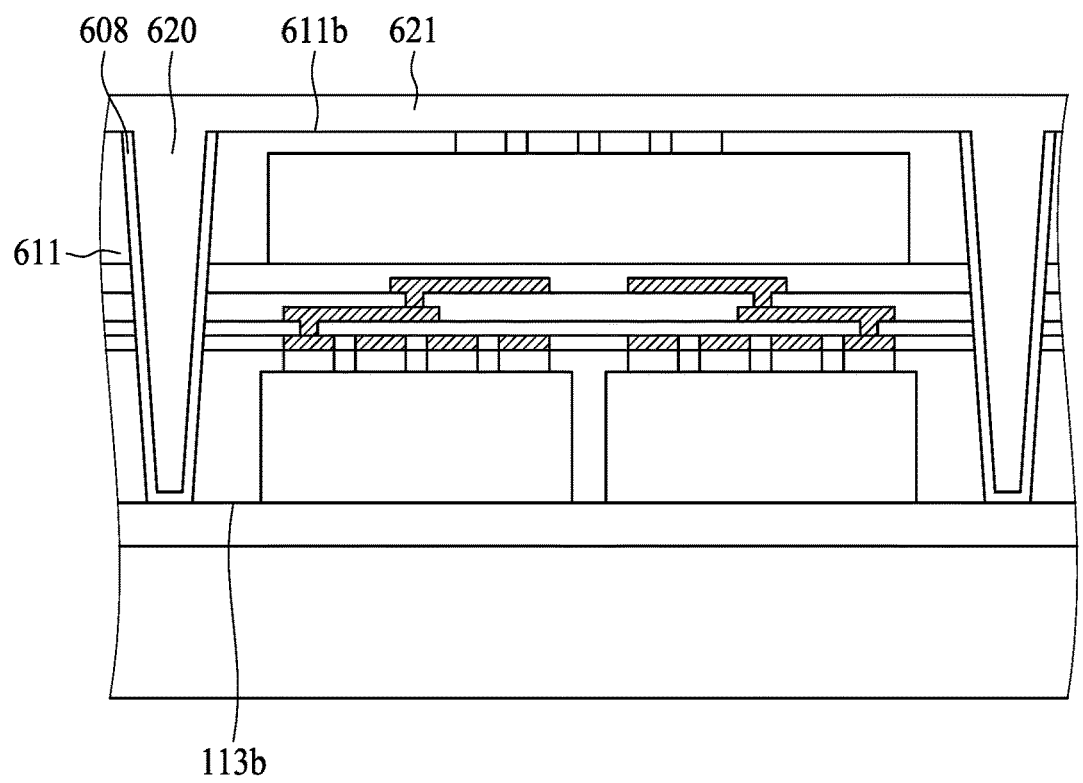
Figure 6L:
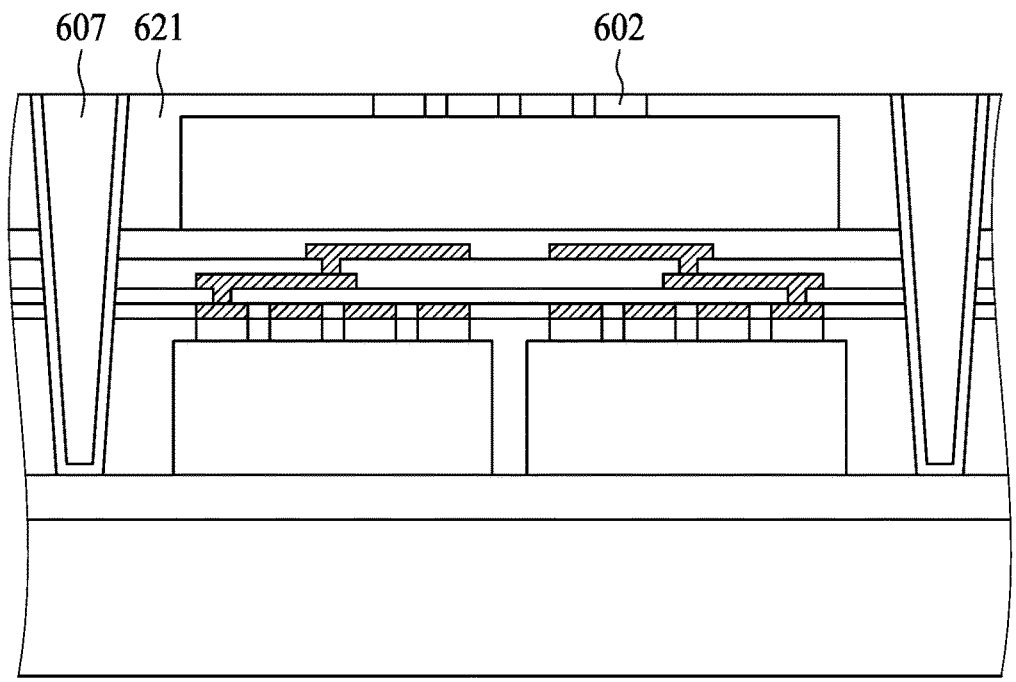
Figure 6M:
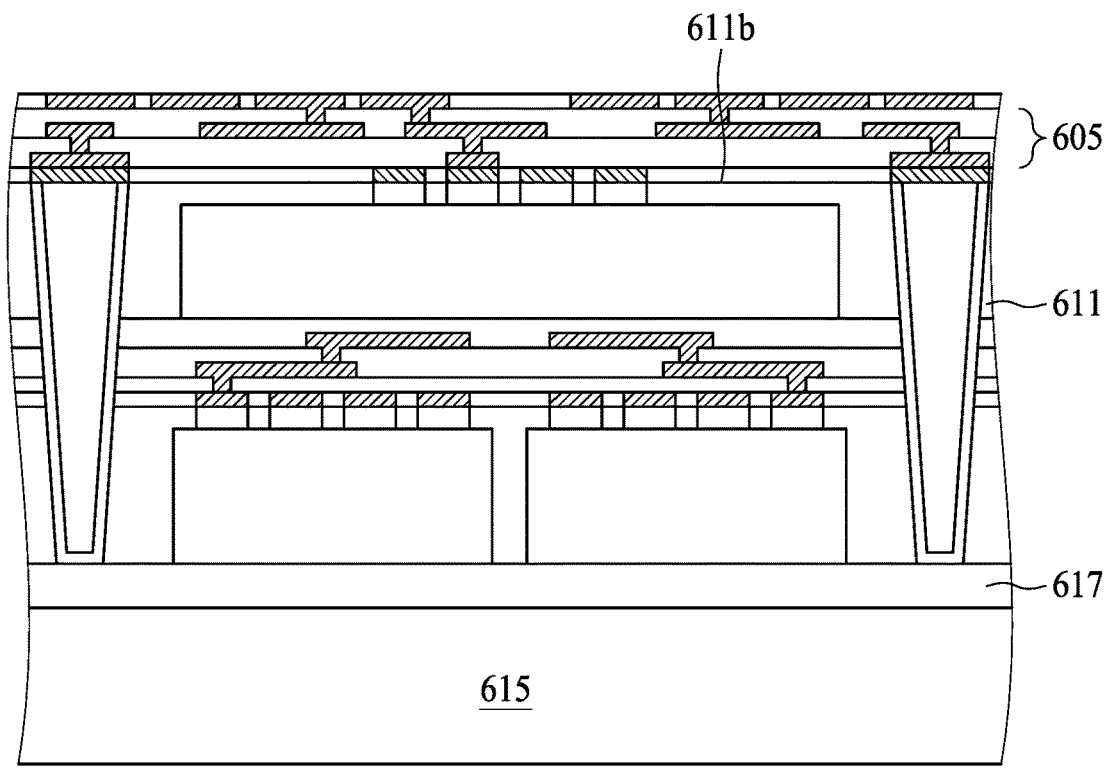
Figure 6N:
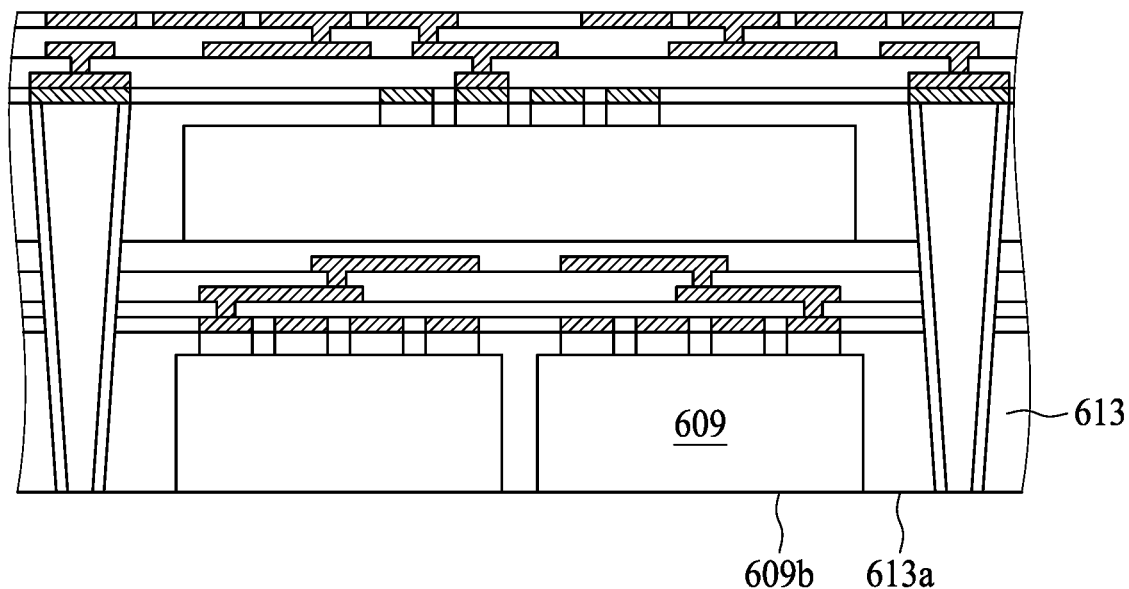
Figure 6O:
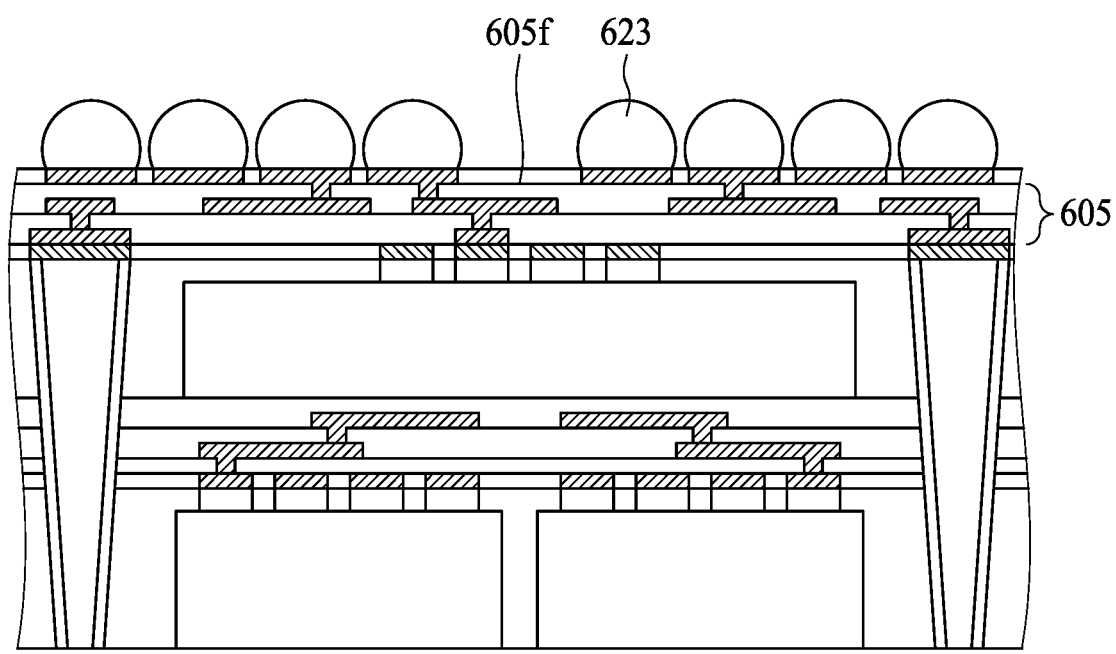

FIGS. 6A-6O illustrate a method of manufacturing a semiconductor device package such as the semiconductor device package 300 of FIG. 3.

Referring to FIG. 6A-6H, the processes illustrated in FIG. 6A-6H for providing the carrier 615, the release layer 617, the first semiconductor element 609, the first encapsulant 613, the first RDL 603, the second semiconductor element 601, and the second encapsulant 611 are similar to those illustrated in FIG. 5A-5H, which are not described repeatedly for brevity.

Referring to FIG. 6I, a laser drilling process is performed from the second encapsulant bottom surface 611b of the second encapsulant 611 toward a release top surface 617a of the release layer 617 to form a via 619 exposing at least a portion of the release top surface 617a of the release layer 617.

Referring to FIG. 6J, a first seed layer 608 is disposed on the sidewall 607c of the via 619 and on at least a portion of the exposed portion of the release top surface 617a of the release layer 617. In some embodiments, the first seed layer 608 is disposed in conformity with the shape of the via 619. The first seed layer 608 may be disposed by a plating technique, a physical vapor deposition technique, or other suitable process.

Referring to FIG. 6K, a conductive layer 621 is disposed in the opening 620 defined by the first seed layer 608 and on at least a portion of the second encapsulant bottom surface 611b of the second encapsulant 611. The conductive layer 621 may fill the opening 620 and cover at least a portion of the first seed layer 608. The conductive layer 621 may be disposed by, for example, a plating technique such as electroplating, or other suitable process.

Referring to FIG. 6L, a portion of the conductive layer 621 is removed until at least a portion of the second conductive terminal 602 is exposed. In addition, a conductive via 607 may be formed. The conductive layer 621 may be removed by, for example, a grinding technique, a polishing technique, an etching technique, or other suitable processes.

Referring to FIG. 6M, a second RDL 605 is disposed adjacent to the second encapsulant bottom surface 611b of the second encapsulant 611. The second RDL 605 may be disposed in a manner similar to those described for FIG. 5P, which are not described repeatedly for brevity.

Referring to FIG. 6N, the carrier 615 and the release layer 617 are removed completely, which should expose the first back surface 609b of the first semiconductor element 609 and the first encapsulant top surface 613a of the first encapsulant 613. The carrier layer 615 and the release layer 617 may be removed by, for example, a grinding technique, a polishing technique, an etching technique, or other suitable processes.

Referring to FIG. 6O, at least one electrical connector 623 is disposed adjacent to the second bottom surface 605f of the second RDL 605. The electrical connector 623 may be disposed in a manner similar to those described for FIG. 5Q, which are not described repeatedly for brevity. Subsequently, a semiconductor device package (e.g., a semiconductor package 300 as is illustrated in FIG. 3) may be obtained.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a line or a plane can be substantially flat if a peak or depression of the line or plane is no greater than 5 µm, greater than 1 µm, or no greater than 0.5 µm.

As used herein, the singular terms "a," "an," and "the" may include plural referents unless the context clearly dictates otherwise. In the description of some embodiments, a component provided "on or "over" another component can encompass cases where the former component is directly on (e.g., in physical contact with) the later component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor device package comprising:
    a first electronic component having a first active surface, and including a first conductive terminal disposed on and protruding from the first active surface of the first electronic component;
    a first encapsulant encapsulating the first electronic component, and having a first surface substantially aligned with a surface of the first conductive terminal;
    a first circuit pattern structure disposed on the first surface of the first encapsulant, and including a plurality of conductive layers;
    a second circuit pattern structure disposed on a second surface of the first encapsulant opposite to the first surface of the first encapsulant,
    a second electronic component disposed on the second circuit pattern structure, having a second active surface facing the second circuit pattern structure and a back surface opposite to the second active surface, and including a second conductive terminal disposed on and protruding from the second active surface of the second electronic component;
    a third electronic component disposed on the second circuit pattern structure and arranged adjacent to the second electronic component, the third electronic component having a third active surface facing the second circuit pattern structure and a back surface opposite to the third active surface, and including a third conductive terminal disposed on and protruding from the third active surface of the third electronic component, wherein the second electronic component is electrically connected to the third electronic component through the second circuit pattern structure; and
    a second encapsulant encapsulating the second electronic component and the third electronic component, and having a third surface substantially aligned with a surface of the second conductive terminal and a surface of the third conductive terminal, wherein the back surface of the second electronic component and the back surface of the third electronic component are substantially aligned with a fourth surface opposite to the third surface of the second encapsulant,
    a conductive via disposed between the second circuit pattern structure and the first circuit pattern structure;
    a plurality of electrical connectors disposed on the first circuit pattern structure, wherein the second electronic component and the third electronic component are electrically connected to the electrical connectors through the second circuit pattern structure, the conductive via and the first circuit pattern structure, wherein the conductive via is tapered in a direction from the electrical connectors to the second encapsulant, wherein the first encapsulant encapsulates the conductive via, and wherein the conductive via includes a bulge portion protruding from a lateral surface of the conductive via, and wherein the bulge portion protrudes toward the first encapsulant; and
    a seed layer disposed between the first encapsulant and the conductive via, wherein a portion of the seed layer is conformal with the bulge portion.

2. A semiconductor device package, comprising:
    a first electronic component having a first active surface, and including a first conductive terminal disposed on and protruding from the first active surface of the first electronic component;
    a first encapsulant encapsulating the first electronic component, and having a first surface substantially aligned with a surface of the first conductive terminal;
    a first circuit pattern structure disposed on the first surface of the first encapsulant, and including a plurality of conductive layers;
    a second circuit pattern structure disposed on a second surface of the first encapsulant opposite to the first surface of the first encapsulant;
    a second electronic component disposed on the second circuit pattern structure, having a second active surface facing the second circuit pattern structure and a back surface opposite to the second active surface, and including a second conductive terminal disposed on and protruding from the second active surface of the second electronic component;
    a third electronic component disposed on the second circuit pattern structure and arranged adjacent to the second electronic component, the third electronic component having a third active surface facing the second circuit pattern structure and a back surface opposite to the third active surface, and including a third conductive terminal disposed on and protruding from the third active surface of the third electronic component, wherein the second electronic component is electrically connected to the third electronic component through the second circuit pattern structure; and
    a second encapsulant encapsulating the second electronic component and the third electronic component, and having a third surface substantially aligned with a surface of the second conductive terminal and a surface of the third conductive terminal, wherein the back surface of the second electronic component and the back surface of the third electronic component are substantially aligned with a fourth surface opposite to the third surface of the second encapsulant,
    a conductive via disposed between the second circuit pattern structure and the first circuit pattern structure; and
    a plurality of electrical connectors disposed on the first circuit pattern structure, wherein the second electronic component and the third electronic component are electrically connected to the electrical connectors through the second circuit pattern structure, the conductive via and the first circuit pattern structure, wherein the conductive via is tapered in a direction from the electrical connectors to the second encapsulant, wherein the first encapsulant encapsulates the conductive via and includes a filler, and wherein a seed layer is between the conductive via and the first encapsulant, and the seed layer contacts the filler.

3. The semiconductor device package of claim 2, further comprising a conductive via disposed on the first circuit pattern structure, and directly penetrating from a lower surface of the second circuit pattern structure through a top surface of the second circuit pattern structure, wherein the conductive via has a top surface substantially aligned with the fourth surface.

4. The semiconductor device package of claim 3, wherein the second circuit pattern structure is around a lateral surface of the conductive via.

5. The semiconductor device package of claim 4, further comprising a seed layer is around the lateral surface of the conductive via, wherein the seed layer contacts the second circuit pattern structure.

6. The semiconductor device package of claim 2, wherein a width of the second electronic component is less than a width of the first electronic component, and a width of the third electronic component is less than the width of the first electronic component.

7. The semiconductor device package of claim 2, wherein the second electronic component and the third electronic component are overlapped with a vertical projection of the first electronic component.

8. The semiconductor device package of claim 2, wherein the second electronic component is electrically connected to the third electronic component through the second circuit pattern structure, wherein a conductive via is disposed on the first circuit pattern structure, and directly penetrates from a lower surface of the second circuit pattern structure through a top surface of the second circuit pattern structure, wherein the conductive via has a top surface substantially aligned with the fourth surface, and wherein a width of the second electronic component is less than a width of the first electronic component, and a width of the third electronic component is less than the width of the first electronic component.

9. The semiconductor device package of claim 2, wherein the first encapsulant encapsulates the conductive via, and wherein the conductive via includes a bulge portion protruding from a lateral surface of the conductive via, and wherein the bulge portion protrudes toward the first encapsulant.

10. A semiconductor device package, comprising:
a first electronic component having a first active surface, and including a first conductive terminal disposed on and protruding from the first active surface of the first electronic component;
a first encapsulant encapsulating the first electronic component, and having a first surface substantially aligned with a surface of the first conductive terminal;
a first redistribution layer (RDL) on the first surface of the first encapsulant;
a second RDL above a second surface of the first encapsulant opposite to the first surface of the first encapsulant;
a second electronic component above the second RDL;
a second encapsulant disposed on the second RDL and encapsulating the second electronic component a conductive via disposed between the first RDL and the second RDL; and
a seed layer accommodating the conductive via, and in contact with the first RDL, the second RDL, and the first encapsulant,
wherein the seed layer has a top surface substantially aligned with the first surface of the first encapsulant, and wherein a contact area between the seed layer and the second RDL is greater than a contact area between the seed layer and the first RDL.

11. The semiconductor device package of claim 10, wherein the second electronic component has a second active surface facing the second RDL, and includes a second conductive terminal disposed on and protruding from the second active surface of the second electronic component, and wherein the second conductive terminal is electrically connected to the second RDL by a hybrid bonding or a copper-to-copper bonding.

12. The semiconductor device package of claim 11, wherein the second conductive terminal of the second electronic component includes a metal layer and an electrical connector, wherein the metal layer encompasses the electrical connector.

13. The semiconductor device package of claim 10, wherein the conductive via is disposed on the first RDL and penetrates from a lower surface of the second RDL through a top surface of the second RDL, wherein a top surface of the conductive via is substantially aligned with a top surface of the second encapsulant, and a lower surface of the conductive via is substantially aligned with the first surface of the first encapsulant.

14. The semiconductor device package of claim 10, wherein the seed layer has a top surface substantially aligned with the first surface of the first encapsulant, wherein the second electronic component has a second active surface facing the second RDL, and includes a second conductive terminal disposed on and protruding from the second active surface of the second electronic component, wherein the second conductive terminal is electrically connected to the second RDL by a hybrid bonding or a copper-to-copper bonding, wherein the conductive via is disposed on the first RDL and penetrates from a lower surface of the second RDL through a top surface of the second RDL, wherein a top surface of the conductive via is substantially aligned with a top surface of the second encapsulant, and a lower surface of the conductive via is substantially aligned with the first surface of the first encapsulant.

* * * * *